(12) United States Patent
Pham et al.

(10) Patent No.: US 12,381,565 B2
(45) Date of Patent: Aug. 5, 2025

(54) SEMICONDUCTOR INTEGRATED CIRCUIT

(71) Applicant: SONY SEMICONDUCTOR SOLUTIONS CORPORATION, Kanagawa (JP)

(72) Inventors: Tuan Van Pham, Kanagawa (JP); Hironori Nakahara, Kanagawa (JP); Masahisa Tamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/262,129

(22) PCT Filed: Jan. 26, 2022

(86) PCT No.: PCT/JP2022/002798
§ 371 (c)(1),
(2) Date: Jul. 19, 2023

(87) PCT Pub. No.: WO2022/163683
PCT Pub. Date: Aug. 4, 2022

(65) Prior Publication Data
US 2024/0088906 A1    Mar. 14, 2024

(30) Foreign Application Priority Data
Jan. 28, 2021 (JP) .................. 2021-012282

(51) Int. Cl.
*H03L 7/14* (2006.01)
*H03L 7/099* (2006.01)
(Continued)

(52) U.S. Cl.
CPC ............ *H03L 7/0995* (2013.01); *H03L 7/146* (2013.01); *H04N 25/709* (2023.01); *H04N 25/7795* (2023.01); *H03L 2207/50* (2013.01)

(58) Field of Classification Search
CPC ....... H03L 7/14; H03L 7/146; H03L 2207/50; H04N 25/709; H04N 25/7795
See application file for complete search history.

(56) References Cited

U.S. PATENT DOCUMENTS 5,008,629 A * 4/1991 Ohba .................. H03L 7/199
331/25
5,202,906 A * 4/1993 Saito .................. H03L 3/00
331/25
(Continued)

FOREIGN PATENT DOCUMENTS

JP    2003-298948 A    10/2003
JP    2015-220494 A    12/2015
(Continued)

OTHER PUBLICATIONS

International Search Report and Written Opinion of PCT Application No. PCT/JP2022/002798, issued on Apr. 12, 2022, 08 pages of ISRWO.

*Primary Examiner* — Levi Gannon
(74) *Attorney, Agent, or Firm* — CHIP LAW GROUP

(57) ABSTRACT

Provided are a semiconductor integrated circuit and an imaging device capable of reducing power consumption without complicating a configuration of oscillation control. A semiconductor integrated circuit includes an oscillator that generates an oscillation signal whose oscillation frequency is discretely adjustable on the basis of a digital control input signal, an oscillation controller that generates the digital control input signal, and an intermittent controller that
(Continued)

1d: SEMICONDUCTOR INTEGRATED CIRCUIT generates an intermittent control signal and supplies the intermittent control signal to the oscillation controller so that the oscillation controller intermittently updates the digital control input signal.

20 Claims, 31 Drawing Sheets

(51) Int. Cl.
    *H04N 25/709* (2023.01)
    *H04N 25/76* (2023.01)
    *H04N 25/779* (2023.01)

(56) References Cited

U.S. PATENT DOCUMENTS

| | | | | |
|---|---|---|---|---|
| 5,379,002 | A * | 1/1995 | Jokura | H03L 7/189 |
| | | | | 331/25 |
| 7,420,427 | B2 * | 9/2008 | Brown | H03L 7/0893 |
| | | | | 331/10 |
| 7,737,792 | B2 * | 6/2010 | Kawamoto | H03L 7/1976 |
| | | | | 331/10 |
| 2002/0003453 | A1 * | 1/2002 | Segawa | H03L 7/14 |
| | | | | 331/25 |
| 2006/0119402 | A1 * | 6/2006 | Thomsen | H03L 7/197 |
| | | | | 331/10 |
| 2007/0013449 | A1 * | 1/2007 | Ishii | H03L 7/14 |
| | | | | 331/16 |
| 2008/0191762 | A1 * | 8/2008 | Seethamraju | H03L 7/148 |
| | | | | 327/158 |
| 2009/0167443 | A1 * | 7/2009 | Liu | H03L 7/099 |
| | | | | 331/10 |
| 2011/0032013 | A1 * | 2/2011 | Nelson | H03L 7/0994 |
| | | | | 327/156 |
| 2016/0269171 | A1 * | 9/2016 | Sakurai | H03C 3/0966 |
| 2017/0264333 | A1 * | 9/2017 | Hoshino | H03L 7/099 |

FOREIGN PATENT DOCUMENTS

| | | |
|---|---|---|
| JP | 2016-171533 A | 9/2016 |
| JP | 2017-108282 A | 6/2017 |
| JP | 2017-130888 A | 7/2017 |
| JP | 2017-143398 A | 8/2017 |
| WO | 2020/166645 A1 | 8/2020 |

* cited by examiner

1: SEMICONDUCTOR INTEGRATED CIRCUIT

1a: SEMICONDUCTOR INTEGRATED CIRCUIT

1b: SEMICONDUCTOR INTEGRATED CIRCUIT (100: IMAGING DEVICE)

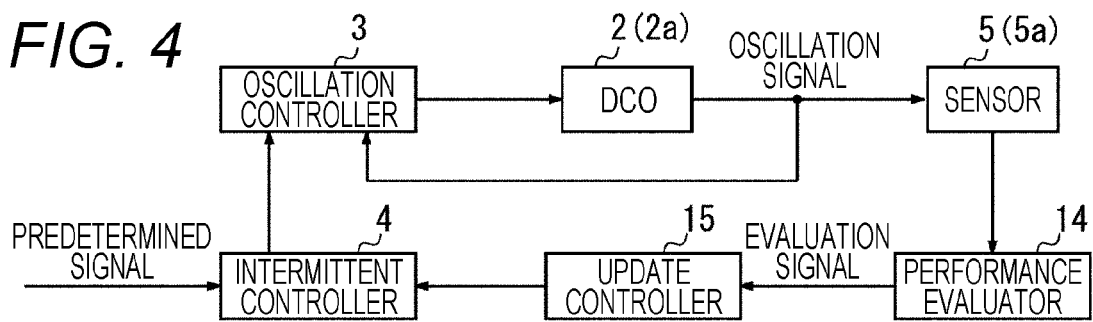
1c: SEMICONDUCTOR INTEGRATED CIRCUIT
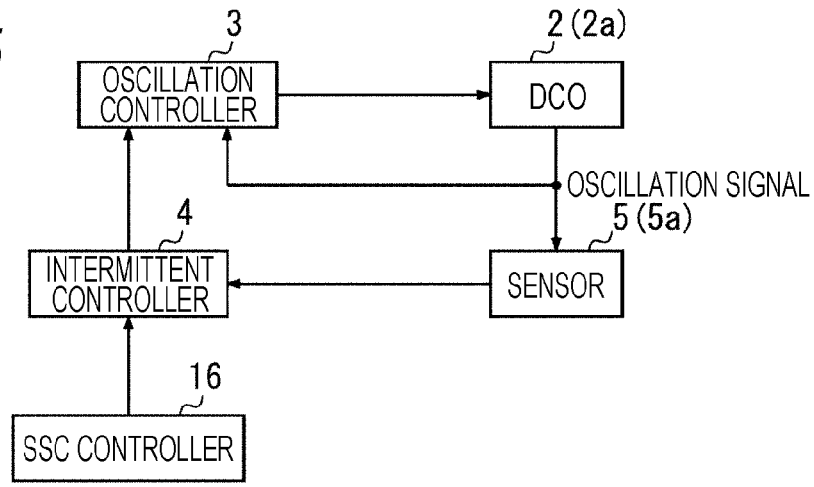
1d: SEMICONDUCTOR INTEGRATED CIRCUIT
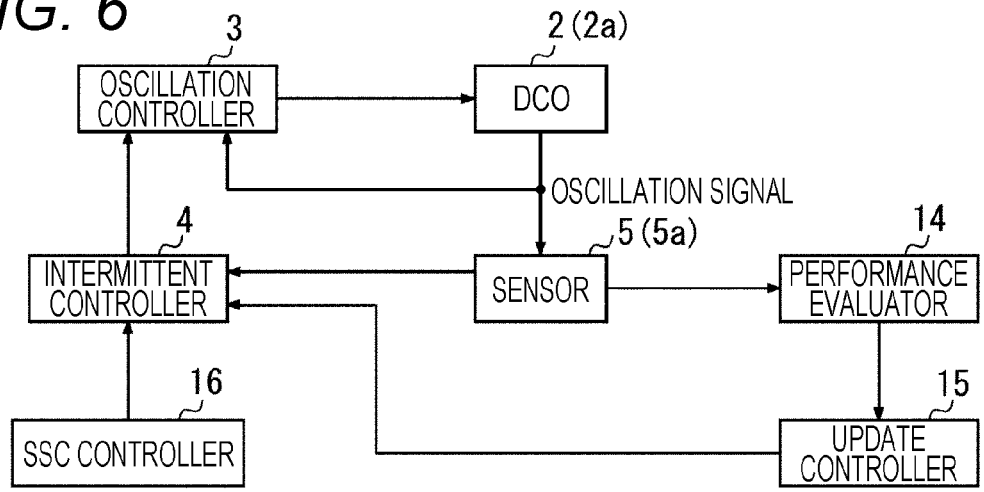
1e: SEMICONDUCTOR INTEGRATED CIRCUIT

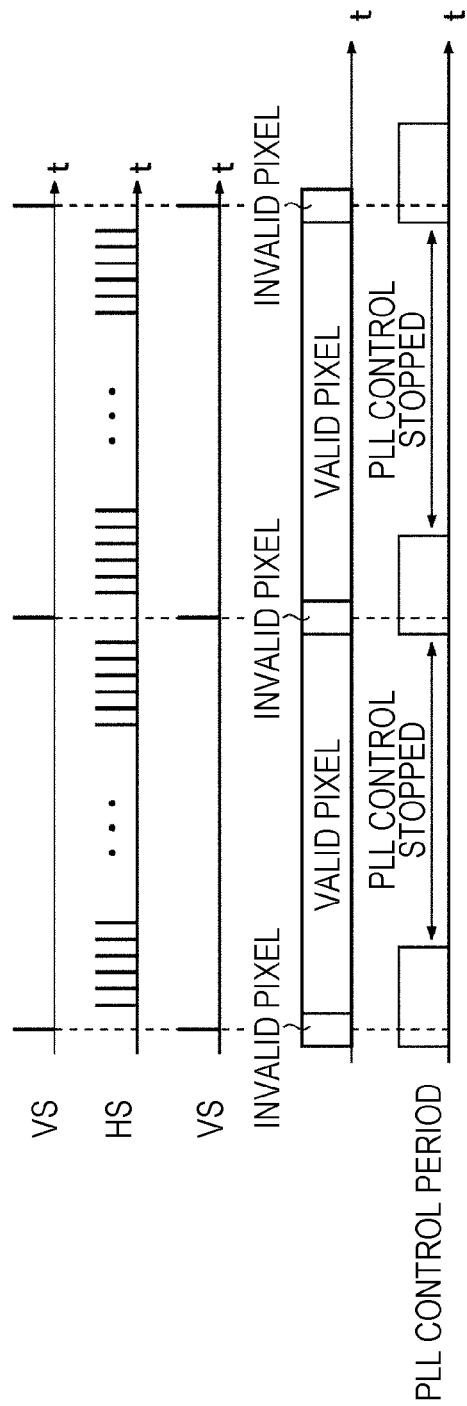

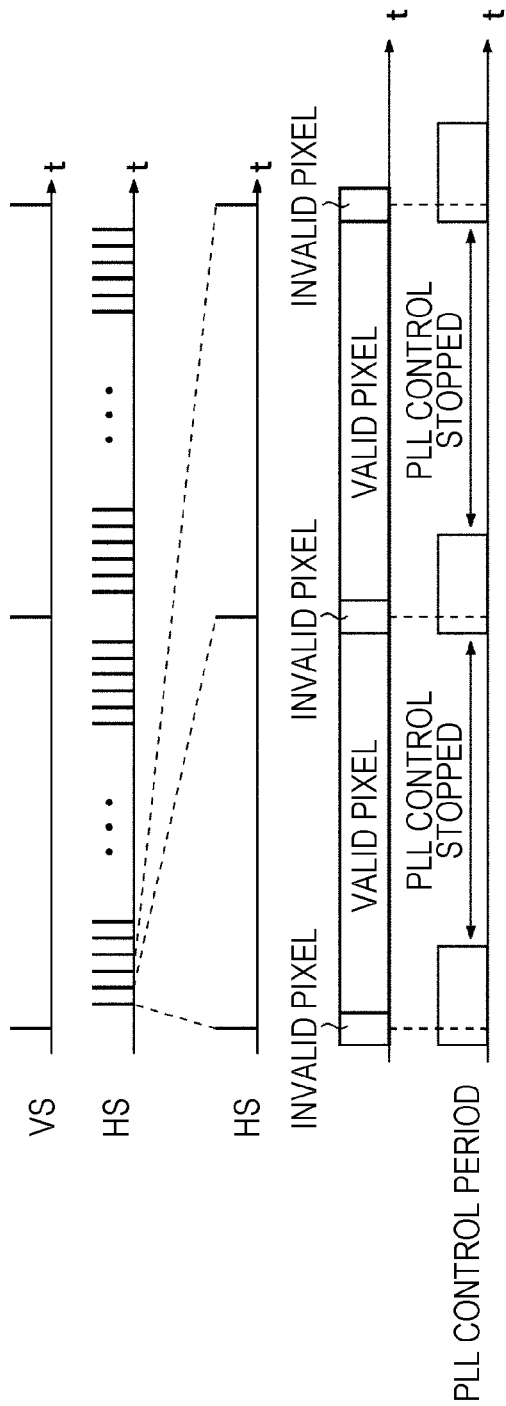

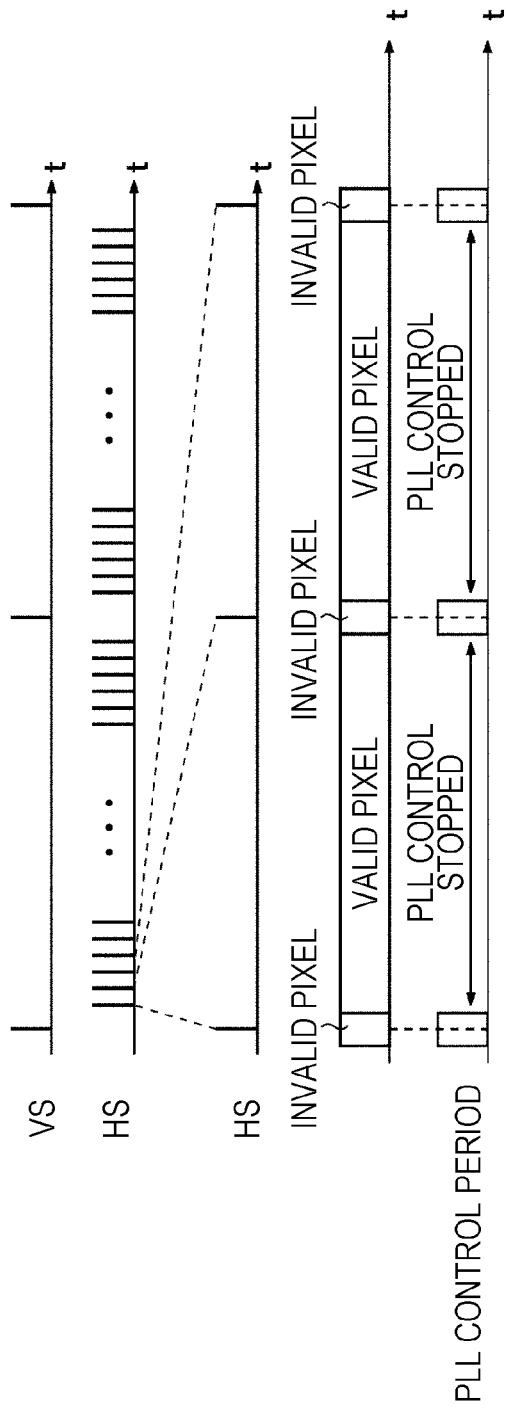

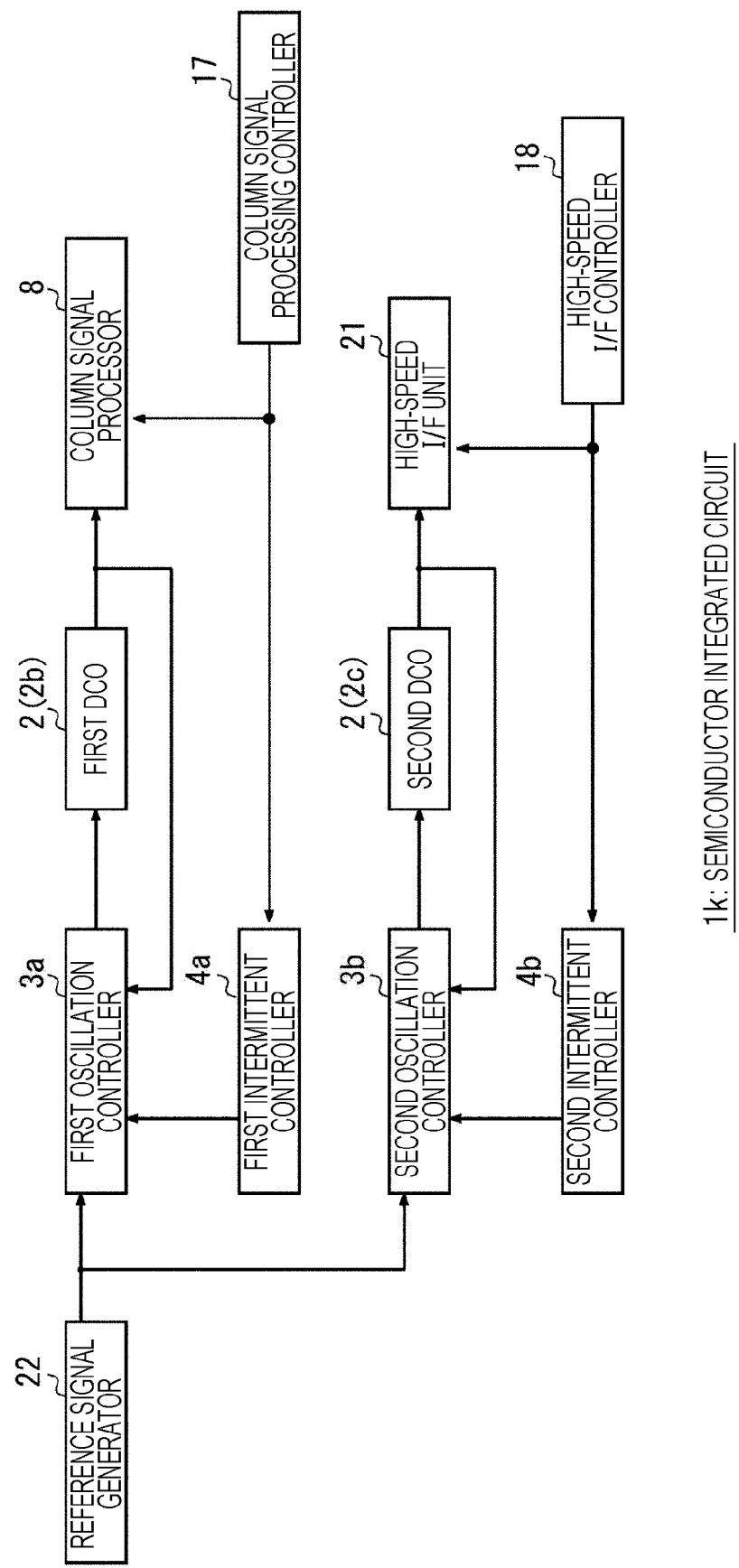

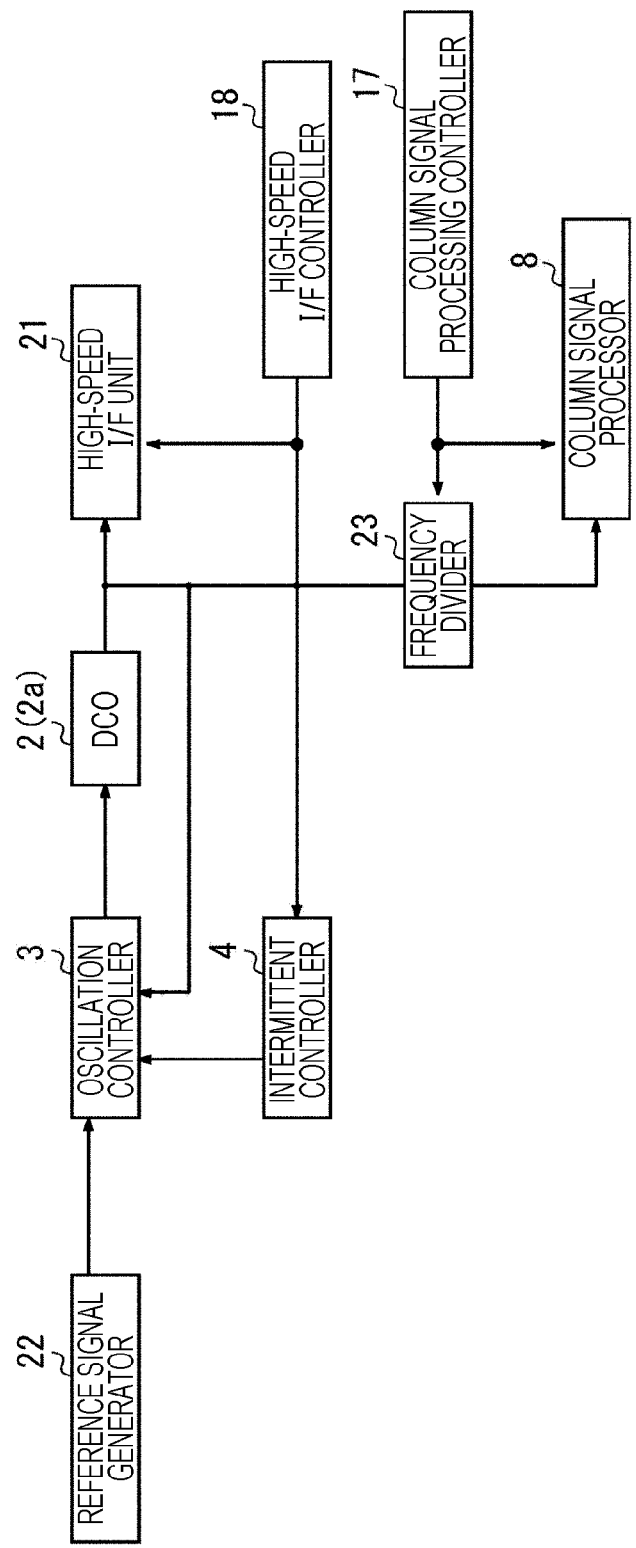

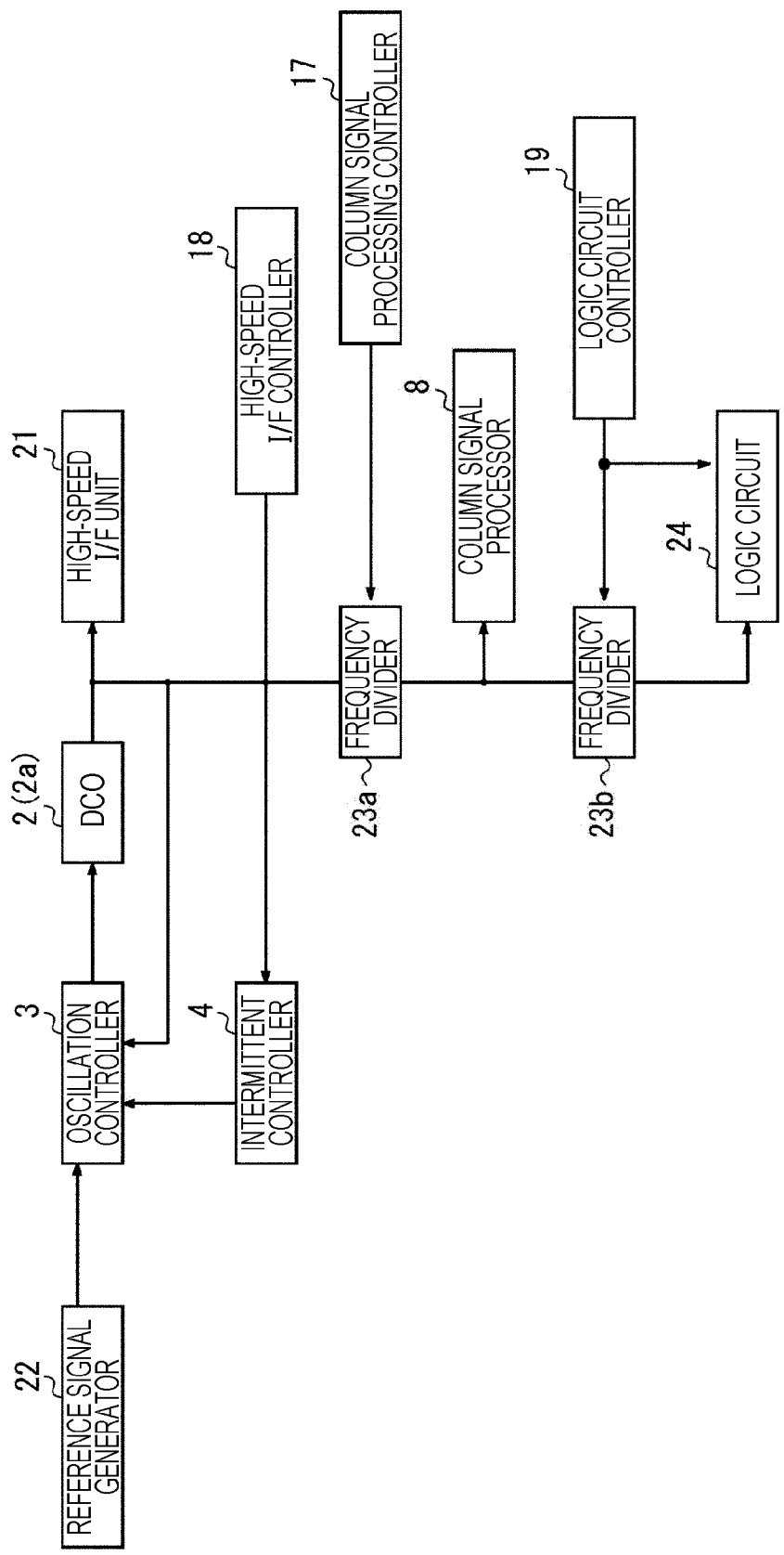

SEMICONDUCTOR INTEGRATED CIRCUIT

CROSS REFERENCE TO RELATED APPLICATIONS

This application is a U.S. National Phase of International Patent Application No. PCT/JP2022/002798 filed on Jan. 26, 2022, which claims priority benefit of Japanese Patent Application No. JP 2021-012282 filed in the Japan Patent Office on Jan. 28, 2021. Each of the above-referenced applications is hereby incorporated herein by reference in its entirety.

TECHNICAL FIELD

The present disclosure relates to a semiconductor integrated circuit.

BACKGROUND ART

There is known a phase locked loop (PLL) circuit that performs feedback control of a frequency of an oscillation signal generated by a digitally controlled oscillator (DCO). Since power consumption increases when a PLL loop of the PLL circuit is always operated, a technology of reducing the power consumption by utilizing an open mode for opening the PLL loop has been proposed (see Patent Documents 1 and 2).

Patent Document 1 discloses a technology of controlling a DCO by a PLL circuit including a digital circuit, whereas Patent Document 2 discloses a technology of performing feedback control of a frequency of an oscillation signal generated by a voltage controlled oscillator by intermittently operating a PLL circuit including an analog circuit.

CITATION LIST

Patent Document

Patent Document 1: Japanese Patent Application Laid-Open No. 2016-171533
Patent Document 2: Japanese Patent Application Laid-Open No. 2015-220494

SUMMARY OF THE INVENTION

Problems to be Solved by the Invention

In Patent Document 1, a period in which the PLL loop is operated in the open mode is determined on the basis of time until immediately before an oscillation frequency of the oscillation signal generated by the DCO shifts by a predetermined change amount, and the control becomes complicated. In addition, Patent Document 1 generates an oscillation signal used for communication applications, and does not intend to generate an oscillation signal for applications other than communication applications.

Furthermore, when the PLL circuit is configured by an analog circuit as in Patent Document 2, leakage occurs, and thus the PLL loop cannot be operated in a complete open mode, and the effect of reducing power consumption is impaired.

Therefore, the present disclosure provides a semiconductor integrated circuit capable of reducing power consumption without complicating a configuration of oscillation control.

Solutions to Problems

In order to solve the above problems, the present disclosure provides a semiconductor integrated circuit including
an oscillator that generates an oscillation signal whose oscillation frequency is discretely adjustable on the basis of a digital control input signal,
an oscillation controller that generates the digital control input signal, and
an intermittent controller that generates an intermittent control signal and supplies the intermittent control signal to the oscillation controller so that the oscillation controller intermittently updates the digital control input signal.

The oscillation controller may hold the digital control input signal most recently updated in a period in which the digital control input signal is not updated by the intermittent control signal.

The intermittent controller may generate the intermittent control signal in synchronization with a predetermined signal generated in the semiconductor integrated circuit or input to the semiconductor integrated circuit.

There may be further included a sensor that performs predetermined sensing in synchronization with the oscillation signal, and
the intermittent controller may generate the intermittent control signal on the basis of a signal generated by the sensor.

The sensor may include
a pixel array unit including a plurality of pixels each of which performs photoelectric conversion, and
a timing controller that controls a photoelectric conversion timing of the plurality of pixels and a timing of reading a signal that is photoelectrically converted, and
the intermittent controller may generate the intermittent control signal on the basis of a signal generated by the timing controller.

The plurality of pixels may be disposed in a horizontal direction and a vertical direction in the pixel array unit,
the timing controller may generate a horizontal synchronization signal and a vertical synchronization signal for reading the signal photoelectrically converted by the plurality of pixels, and
the intermittent controller may generate the intermittent control signal on the basis of at least one of the horizontal synchronization signal or the vertical synchronization signal.

The plurality of pixels in the pixel array unit may include a valid pixel and an invalid pixel, and
the intermittent controller may generate the intermittent control signal so that the oscillation controller updates the digital control input signal in a predetermined period including a signal output period of the invalid pixel, and after a lapse of the predetermined period, the oscillation controller does not update the digital control input signal until a next signal output period of the invalid pixel.

The predetermined period may be longer than the signal output period of the invalid pixel.

The plurality of pixels in the pixel array unit may include a valid pixel and an invalid pixel, and
the intermittent controller may generate the intermittent control signal so that the oscillation controller updates the digital control input signal in a first period including the signal output period of the invalid pixel and in a second period which is a part of a signal output period of the valid pixel, and the oscillation controller does not update the digital control input signal in a period other than the first period and the second period.

A plurality of the second periods may be separately provided in the signal output period of the valid pixel.

There may be further included a frequency divider that converts a frequency of the oscillation signal output from the oscillator, and the sensor may perform the sensing in synchronization with a frequency-divided oscillation signal output from the frequency divider.

There may be further included a performance evaluator that generates an evaluation signal evaluating performance of the sensing of the sensor, and an update controller that controls a period and a frequency in which the oscillation controller updates the digital control input signal on the basis of the evaluation signal, and the intermittent controller may generate the intermittent control signal on the basis of the period and the frequency controlled by the update controller.

The predetermined signal may include a spread spectrum clock control signal.

There may be further included an SSC controller that generates a spread spectrum clock control signal, the oscillator may adjust the frequency of the oscillation signal on the basis of the digital control input signal and the spread spectrum clock control signal, and the intermittent controller may generate the intermittent control signal on the basis of the spread spectrum clock control signal.

The spread spectrum clock control signal may include a periodic signal, the intermittent controller may generate the intermittent control signal so that the oscillation controller updates the digital control input signal in a predetermined period in one cycle of the spread spectrum clock control signal, and the oscillation controller does not update the digital control input signal except for in the predetermined period in the one cycle.

The predetermined period may be a period including at least one of a peak or a bottom of a signal level of the spread spectrum clock control signal.

The present disclosure provides a semiconductor integrated circuit including a first oscillator that generates a first oscillation signal whose oscillation frequency is discretely adjustable on the basis of a first digital control input signal, a first oscillation controller that generates the first digital control input signal, a first intermittent controller that generates a first intermittent control signal and supplies the first intermittent control signal to the first oscillation controller so that the first oscillation controller intermittently updates the first digital control input signal, a second oscillator that generates a second oscillation signal whose oscillation frequency is discretely adjustable on the basis of a second digital control input signal, a second oscillation controller that generates the second digital control input signal, an SSC controller that generates a spread spectrum clock control signal, and a second intermittent controller that generates a second intermittent control signal and supplies the second intermittent control signal to the second oscillation controller so that the second oscillation controller intermittently updates the second digital control input signal, in which the second oscillator adjusts a frequency of the second oscillation signal on the basis of the second digital control input signal and the spread spectrum clock control signal, and the second intermittent controller generates the second intermittent control signal on the basis of the spread spectrum clock control signal.

The present disclosure provides a semiconductor integrated circuit including a first oscillator that generates a first oscillation signal whose oscillation frequency is discretely adjustable on the basis of a first digital control input signal, a first oscillation controller that generates the first digital control input signal, a first intermittent controller that generates a first intermittent control signal and supplies the first intermittent control signal to the first oscillation controller so that the first oscillation controller intermittently updates the first digital control input signal, a signal transmitter that performs signal transmission in synchronization with the first oscillation signal, and a first controller that controls a timing at which the first intermittent controller generates the first intermittent control signal in conjunction with switching of an operation mode of the signal transmitter.

There may be included a second oscillator that generates a first oscillation signal whose oscillation frequency is discretely adjustable on the basis of a second digital control input signal, a second oscillation controller that generates the second digital control input signal, a second intermittent controller that generates a second intermittent control signal and supplies the second intermittent control signal to the second oscillation controller so that the second oscillation controller intermittently updates the second digital control input signal, a signal processor that performs signal processing in synchronization with the second oscillation signal, and a second controller that controls a timing at which the second intermittent controller generates the second intermittent control signal in conjunction with switching of an operation mode of the signal processor.

There may be included a frequency divider that divides a frequency of the first oscillation signal and generates a second oscillation signal, a signal processor that performs signal processing in synchronization with the second oscillation signal, and a second controller that intermittently controls the frequency divider in conjunction with switching of an operation mode of the signal processor.

BRIEF DESCRIPTION OF DRAWINGS

FIG. 4 is a block diagram showing a schematic configuration of a semiconductor integrated circuit according to a second embodiment.

FIG. 5 is a block diagram showing a schematic configuration of a semiconductor integrated circuit according to a third embodiment.

FIG. 6 is a block diagram showing a schematic configuration of a modification of the semiconductor integrated circuit in FIG. 5.

FIG. 13A is a diagram showing output timings of a vertical synchronization signal and a horizontal synchronization signal and a period in which the oscillation controller performs phase locked loop (PLL) control of an oscillation frequency of a digitally controlled oscillator (DCO).

FIG. 13B is a timing chart of a first modification of FIG. 13A.

FIG. 14B is a timing chart of a third modification of FIG. 13A.

FIG. 17 is a block diagram showing a schematic configuration of a semiconductor integrated circuit according to a seventh embodiment.

FIG. 18 is a block diagram showing a schematic configuration of a semiconductor integrated circuit as a first modification of the semiconductor integrated circuit in FIG. 17.

FIG. 19 is a block diagram showing a schematic configuration of a semiconductor integrated circuit as a second modification of the semiconductor integrated circuit in FIG. 17.

MODE FOR CARRYING OUT THE INVENTION

Hereinafter, embodiments of a semiconductor integrated circuit will be described with reference to the drawings. Although principal components of the semiconductor integrated circuit are mainly described below, the semiconductor integrated circuit can have components and functions that are not shown or described. The following description does not exclude components and functions that are not shown or described.

First Embodiment

Figure 1:
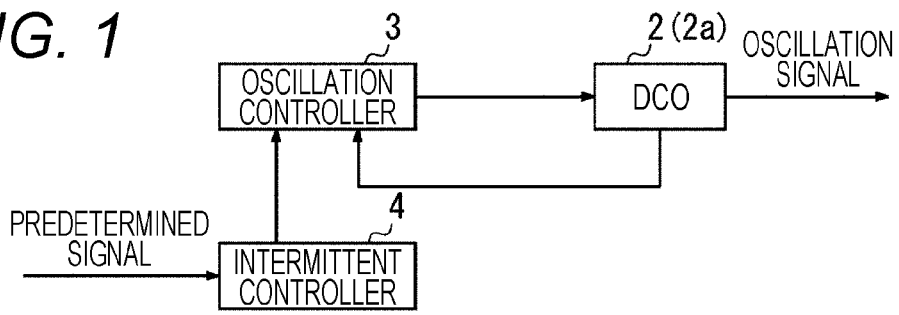
FIG. 1 is a block diagram showing a schematic configuration of a semiconductor integrated circuit according to a first embodiment.

FIG. 1 is a block diagram showing a schematic configuration of a semiconductor integrated circuit 1 according to a first embodiment. The semiconductor integrated circuit 1 in FIG. 1 can be housed in one package and formed into a chip, for example. The semiconductor integrated circuit 1 in FIG. 1 includes an oscillator 2, an oscillation controller 3, and an intermittent controller 4.

The oscillator 2 is a digitally controlled oscillator (DCO) 2a that generates an oscillation signal whose oscillation frequency can be discretely adjusted on the basis of a digital control input signal. In the following description, the oscillator 2 is herein referred to as the DCO 2a, and a frequency band of the oscillation frequency adjustable by the DCO 2a is arbitrary.

The oscillation controller 3 generates the digital control input signal. As will be described later, the oscillation controller 3 configures a phase locked loop (PLL) circuit, and performs feedback control of the frequency of the oscillation signal generated by the DCO 2a by a PLL loop. The feedback control of the frequency of the oscillation signal by the PLL loop may be herein referred to as PLL control.

The intermittent controller 4 generates an intermittent control signal so that the oscillation controller 3 intermittently updates the digital control input signal, and the intermittent controller 4 supplies the intermittent control signal to the oscillation controller 3. The oscillation controller 3 holds the most recently updated digital control input signal in a period in which the digital control input signal is not updated by the intermittent control signal. In this case, the DCO 2a continuously generates the oscillation signal of the same frequency on the basis of the most recently updated digital input signal.

The intermittent controller 4 generates the intermittent control signal on the basis of a predetermined signal. The predetermined signal may be a signal generated in the semiconductor integrated circuit 1 or a signal input to the semiconductor integrated circuit 1. That is, the specific content of the predetermined signal is not limited. The predetermined signal is, for example, a periodic signal.

Figure 2:
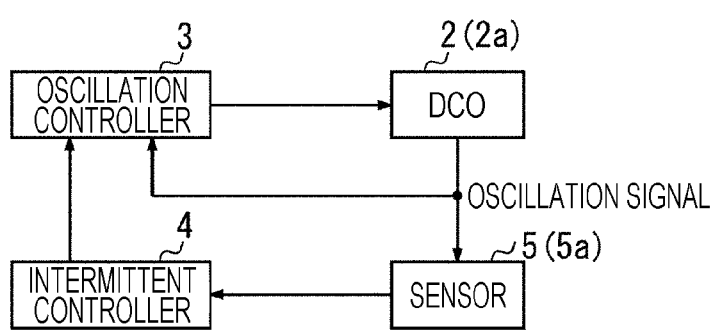
FIG. 2 is a block diagram showing a schematic configuration of a semiconductor integrated circuit as a first modification of the semiconductor integrated circuit of FIG. 1.

FIG. 2 is a block diagram showing a schematic configuration of a semiconductor integrated circuit 1a as a first modification of the semiconductor integrated circuit 1 in FIG. 1. In FIG. 2, components common to those in FIG. 1 are denoted by the same reference signs, and differences will be mainly described below. The semiconductor integrated circuit 1a in FIG. 2 includes a sensor 5 in addition to the configuration of the semiconductor integrated circuit 1 in FIG. 1. The sensor 5 performs predetermined sensing in synchronization with the oscillation signal. The specific content of the sensing is not limited. For example, the sensor 5 may be an image sensor or another sensor 5. The intermittent controller 4 in FIG. 2 generates the intermittent control signal on the basis of a signal generated by the sensor 5.

Figure 3:
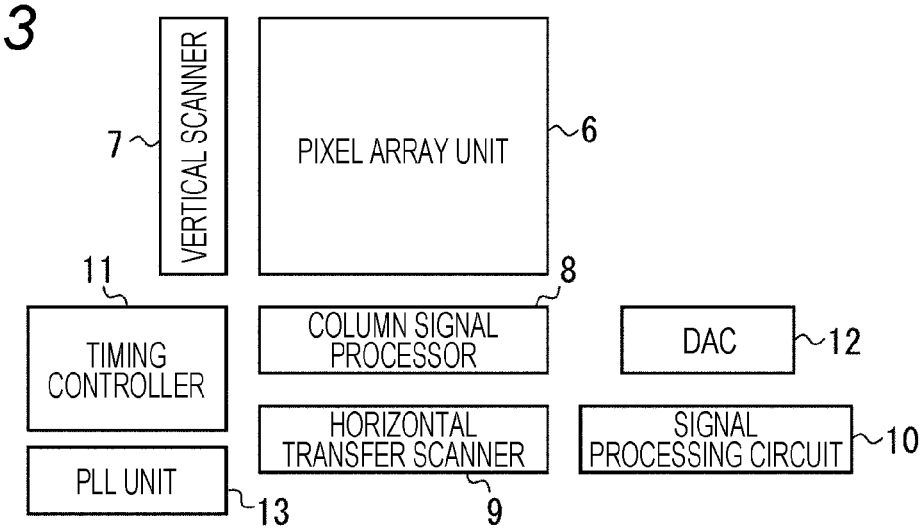
FIG. 3 is a block diagram showing a schematic configuration of a semiconductor integrated circuit in a case where a sensor is an image sensor.

FIG. 3 is a block diagram showing a schematic configuration of a semiconductor integrated circuit 1b in a case where the sensor 5 is an image sensor 5a. The image sensor 5a in the semiconductor integrated circuit 1b in FIG. 3 includes a pixel array unit 6, a vertical scanner 7, a column signal processor 8, a horizontal transfer scanner 9, a signal processing circuit 10, a timing controller 11, a DAC 12, and a PLL unit 13. The semiconductor integrated circuit 1b in FIG. 3 shows a configuration of at least a part of the imaging device 100.

The pixel array unit 6 includes a plurality of pixels each of which performs photoelectric conversion. The plurality of pixels is arranged in a row direction and a column direction. Each of the pixels is divided into a plurality of color pixels in some cases, but is not shown in FIG. 3. Each pixel includes a photoelectric conversion element (not shown) and a read circuit. An imaging signal photoelectrically converted by the photoelectric conversion element of each pixel is sent to the column signal processor 8 via a signal line extending in the row direction.

The vertical scanner 7 drives a pixel column for every row in units of a pixel column including two or more pixels disposed in the column direction.

The column signal processor 8 performs AD conversion of the imaging signal in units of pixel column. The column signal processor 8 includes a comparator, a counter, a latch circuit, and the like. The comparator compares a ramp wave signal generated by the DAC 12 with the imaging signal of each pixel. The counter performs AD conversion processing by counting a time until coincidence is detected by the comparator. The latch holds a count value of the counter. In addition, the latch also performs correlated double sampling (CDS) by calculating a difference between a count value of a D-phase corresponding to a signal level of a pixel signal and a count value of a P-phase corresponding to a reset level of the pixel signal.

The horizontal transfer scanner 9 sequentially transfers a digital imaging signal output from the latch in the column direction. The signal processing circuit 10 performs various types of signal processing on the basis of the digital imaging signal transferred by the horizontal transfer scanner 9.

The timing controller 11 controls a timing of photoelectric conversion of the plurality of pixels and a timing of reading the photoelectrically converted signal. Specifically, the timing controller 11 generates various signals used by the vertical scanner 7 and the column signal processor 8 to drive the pixels, transfer the imaging signals, and perform the AD conversion. The signals generated by the timing controller 11 are, for example, a vertical synchronization signal, a horizontal synchronization signal, a pixel clock signal, and the like.

The PLL unit 13 includes the DCO 2a, the oscillation controller 3, and the intermittent controller 4 in FIG. 1. The intermittent controller 4 generates the intermittent control signal on the basis of the signal generated by the timing controller 11. As a specific example, the intermittent controller 4 generates the intermittent control signal on the basis of at least one of the horizontal synchronization signal or the vertical synchronization signal generated by the timing controller 11. In this case, the DCO 2a intermittently performs the PLL control of the oscillation frequency of the oscillation signal in synchronization with at least one of the horizontal synchronization signal or the vertical signal. Therefore, more power consumption can be reduced than in a case where the PLL control is always performed.

In this way, the intermittent controller 4 in the semiconductor integrated circuit 1b in FIG. 3 can generate the intermittent control signal by diverting a signal generated by the timing controller 11, such as the vertical synchronization signal or the horizontal synchronization signal. It is therefore not necessary to separately generate the timing signal for the intermittent control signal, and timing control of the intermittent control signal becomes easier.

As described above, in the semiconductor integrated circuits 1, 1a, and 1b according to the first embodiment, the oscillation controller 3 intermittently performs the PLL control of the oscillation frequency of the DCO 2a on the basis of the intermittent control signal, and thus more power consumption can be reduced than in the case where the PLL control is always performed. In particular, by generating the intermittent control signal on the basis of the signal (for example, the vertical synchronization signal, the horizontal synchronization signal, or the like) generated by the sensor 5, the generation of the intermittent control signal is facilitated, and the power consumption of the semiconductor integrated circuits 1, 1a, and 1b can be reduced without complicating the internal configurations of the intermittent controller 4 and the oscillation controller 3.

Second Embodiment

Sensing performance of the sensor 5 changes depending on an operation frequency of the sensor 5 in some cases. For example, the image sensor 5a can have reduced sensing sensitivity in a low frequency region in some cases. Therefore, a sensing signal of the sensor 5 may be monitored to evaluate the performance of the sensor 5, and the intermittent control signal may be generated on the basis of a result of the evaluation.

FIG. 4 is a block diagram showing a schematic configuration of a semiconductor integrated circuit 1c according to a second embodiment. The semiconductor integrated circuit 1c in FIG. 4 includes a performance evaluator 14 and an update controller 15 in addition to the DCO 2a, the oscillation controller 3, and the intermittent controller 4.

The performance evaluator 14 generates an evaluation signal for evaluating the performance of sensing of the sensor 5. For example, the performance evaluator 14 detects a magnitude of a noise component included in the sensing signal of the sensor 5 and generates an evaluation signal corresponding to the magnitude of the noise component.

The update controller 15 controls a period and frequency in which the oscillation controller 3 updates the digital control input signal on the basis of the evaluation signal. For example, in a case where the update controller determines that the performance of the sensor 5 is low, the update controller 15 performs control so that the period in which the DCO 2a performs the PLL control of the oscillation frequency becomes long.

The intermittent controller 4 generates the intermittent control signal on the basis of the period and the frequency controlled by the update controller 15. As a result, the intermittent controller 4 can generate the intermittent control signal in consideration of the performance of the sensor 5. Therefore, the oscillation controller 3 can shorten the period of performing the PLL control of the oscillation frequency of the DCO 2a as the performance of the sensor 5 is higher, and can lengthen the period of performing the PLL control of the oscillation frequency of the DCO 2a as the performance of the sensor 5 is lower.

In addition, whether or not to operate the DCO 2a in a free-run state may be determined on the basis of the evaluation signal of the performance evaluator 14.

In this way, in the second embodiment, since the oscillation controller 3 adjusts the period and frequency of performing the PLL control of the oscillation frequency of the DCO 2a in accordance with the performance of the sensor 5, the power consumption can be reduced without degrading the performance of the sensor 5. In general, as the period in which the oscillation controller 3 performs PLL control on the oscillation frequency of the DCO 2a is shorter, noise characteristics are improved, but on the other hand, the oscillation frequency is more likely to fluctuate. Therefore, the performance evaluator 14 generates the evaluation signal in comprehensive consideration of the noise characteristics, the fluctuation of the oscillation frequency, and the like, and generates the intermittent control signal on the basis of the evaluation signal. It is therefore possible to obtain the semiconductor integrated circuit 1c having an excellent S/N ratio, less fluctuation in oscillation frequency, and lower power consumption.

Third Embodiment

In a case where the frequency of a high-speed clock signal used in a high-speed interface or the like is always constant, there is a possibility that electromagnetic interference (EMI) noise due to the frequency occurs. As a countermeasure against the occurrence, spread spectrum clocking (SSC) for changing the frequency of the oscillation signal within a predetermined frequency band may be performed.

FIG. 5 is a block diagram showing a schematic configuration of a semiconductor integrated circuit 1d according to a third embodiment. The semiconductor integrated circuit 1d in FIG. 5 includes the DCO 2a, the oscillation controller 3, the intermittent controller 4, and an SSC controller 16.

The SSC controller 16 generates a spread spectrum clock control signal (hereinafter, the SSC control signal). The SSC control signal is a signal for performing control to change the frequency of the oscillation signal generated by the DCO 2a within a predetermined frequency band.

The intermittent controller 4 generates the intermittent control signal on the basis of the SSC control signal. The SSC control signal is a signal whose voltage level fluctuates, and the oscillation controller 3 changes the oscillation frequency of the DCO 2a in accordance with the voltage level of the SSC control signal. The intermittent controller 4 generates the intermittent control signal so that the oscillation controller 3 performs the PLL control, for example, when the SSC control signal is in a predetermined voltage range. A specific example of generating the intermittent control signal from the SSC control signal will be described later.

The intermittent controller 4 may generate the intermittent control signal in consideration of not only the SSC control signal but also the signal (for example, the vertical synchronization signal, the horizontal synchronization signal, and the like described above) generated by the sensor 5. The oscillation controller 3 generates the digital control input signal on the basis of the intermittent control signal, and the DCO 2a controls the oscillation frequency of the oscillation signal on the basis of the digital control signal. The oscillation controller 3 intermittently performs the PLL control of the oscillation frequency of the DCO 2a on the basis of the digital control input signal, and changes the oscillation frequency within a predetermined frequency band.

The semiconductor integrated circuit 1d in FIG. 5 may be provided with the performance evaluator 14 and the update controller 15 similar to those of FIG. 4. FIG. 6 is a block diagram showing a schematic configuration of a modification of the semiconductor integrated circuit 1d in FIG. 5. A semiconductor integrated circuit 1e in FIG. 6 includes the performance evaluator 14 and the update controller 15 in addition to the configuration of the semiconductor integrated circuit 1d in FIG. 5. In the semiconductor integrated circuit 1d in FIG. 6, in consideration of the performance of the sensor 5, the oscillation controller 3 controls the period and frequency of the PLL control of the oscillation frequency of the DCO 2a, and changes the oscillation frequency of the DCO 2a within a predetermined frequency band on the basis of the SSC control signal.

In this way, the oscillation controller 3 according to the third embodiment intermittently performs the PLL control of the oscillation frequency of the DCO 2a on the basis of the SSC control signal. As a specific example, the oscillation controller 3 intermittently performs the PLL control of the oscillation frequency of the DCO 2a on the basis of the SSC control signal and the signal generated by the sensor 5. In the present embodiment, since the intermittent controller 4 can generate the intermittent control signal on the basis of the SSC control signal, a processing operation of the intermittent controller 4 can be simplified, and the power consumption of the semiconductor integrated circuits 1c and 1d can be reduced.

Fourth Embodiment

As shown in FIG. 3, the imaging device 100 transfers the imaging signal photoelectrically converted in each pixel to the column signal processor 8 to perform AD conversion, and then performs the signal processing in the signal processing circuit 10. The frequency of the oscillation signal used for the AD conversion does not necessarily match the frequency of the oscillation signal used for the signal processing by the signal processing circuit 10. Therefore, a configuration is considered in which the DCO 2*a* that generates the oscillation signal for the AD conversion and the DCO 2*a* that generates the oscillation signal for the signal processing are separately provided.

Figure 7:
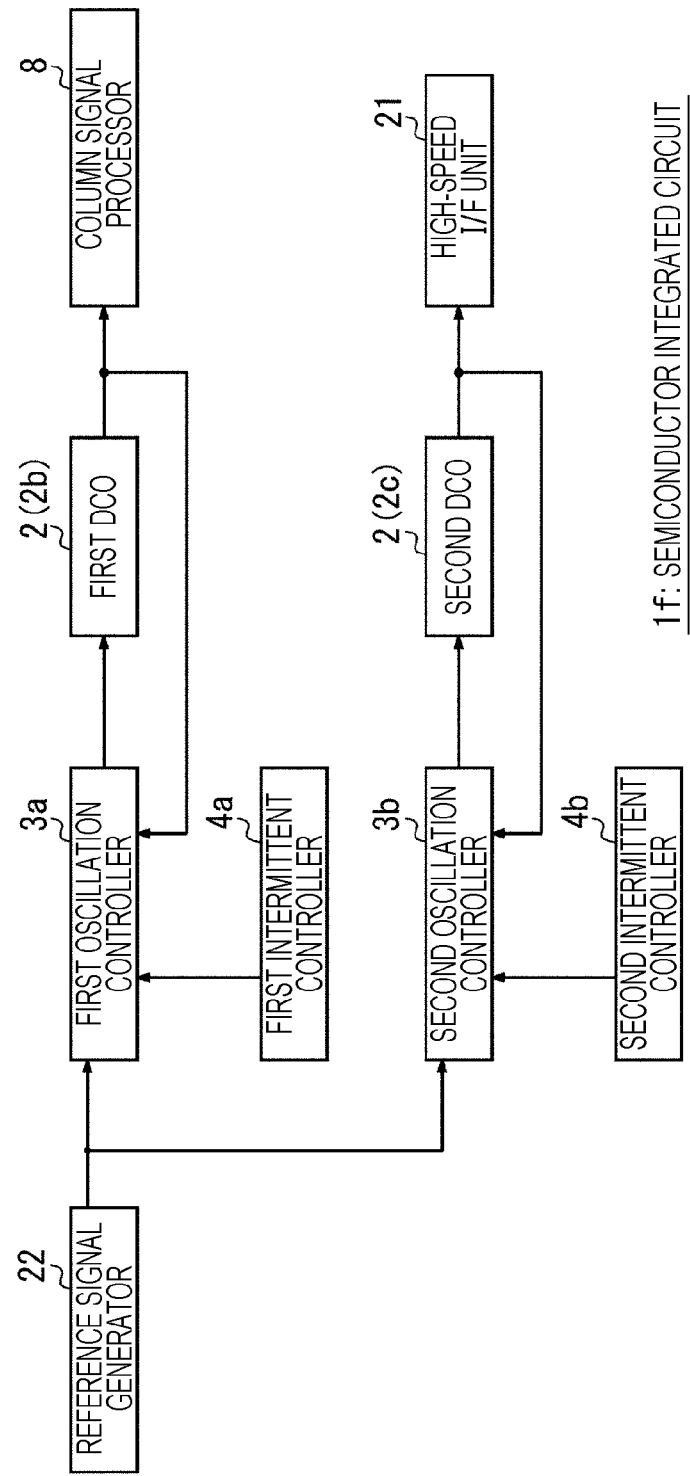
FIG. 7 is a block diagram showing a schematic configuration of a semiconductor integrated circuit according to a fourth embodiment.

FIG. 7 is a block diagram showing a schematic configuration of a semiconductor integrated circuit 1*f* according to a fourth embodiment. The semiconductor integrated circuit 1*f* in FIG. 7 shows a configuration of at least a part of the imaging device 100.

The semiconductor integrated circuit 1*f* in FIG. 7 includes a first DCO 2*b*, a first oscillation controller 3*a*, a first intermittent controller 4*a*, the column signal processor 8, a second DCO 2*c*, a second oscillation controller 3*b*, a second intermittent controller 4*b*, a high-speed interface unit (high-speed I/F unit) 21, and a reference signal generator 22.

The first DCO 2*b* generates a first oscillation signal used for AD conversion processing by the comparator, the counter, and the latch circuit in the column signal processor 8. The first oscillation controller 3 performs the PLL control of the oscillation frequency of the first oscillation signal. The first intermittent controller 4 generates the first intermittent control signal for the first oscillation controller 3 to intermittently perform oscillation control of the first oscillation signal.

The second DCO 2*c* generates a second oscillation signal used by the high-speed I/F unit 21 to transmit and receive a serial signal. The second oscillation controller 3 performs the PLL control of the oscillation frequency of the second oscillation signal. The second intermittent controller 4 generates the second intermittent control signal for the second oscillation controller 3 to intermittently perform oscillation control of the second oscillation signal. The second oscillation signal is a signal having a higher frequency than the first oscillation signal.

The reference signal generator 22 generates a reference oscillation signal used for the first DCO 2*b* and the second DCO 2*c* to perform an oscillation operation.

The high-speed I/F unit 21 transmits a signal to the signal processing circuit 10, for example. Specifically, the high-speed I/F unit 21 synchronizes the digital imaging signal subjected to the AD conversion by the column signal processor 8 with the second oscillation signal and transmits the digital imaging signal to the signal processing circuit 10. Alternatively, the high-speed I/F unit 21 transmits the digital imaging signal subjected to AD conversion by the column signal processor 8 to a host device (not shown), and receives a serial signal transmitted from the host device.

Since the semiconductor integrated circuit 1*f* in FIG. 7 includes the first DCO 2*b*, the first oscillation controller 3*a*, and the first intermittent controller 4 for generating the first oscillation signal, and the second DCO 2*c*, the second oscillation controller 3*b*, and the second intermittent controller 4 for generating the second oscillation signal, the semiconductor integrated circuit 1*f* has a complicated internal configuration and cannot achieve low power consumption and miniaturization.

Figure 8:
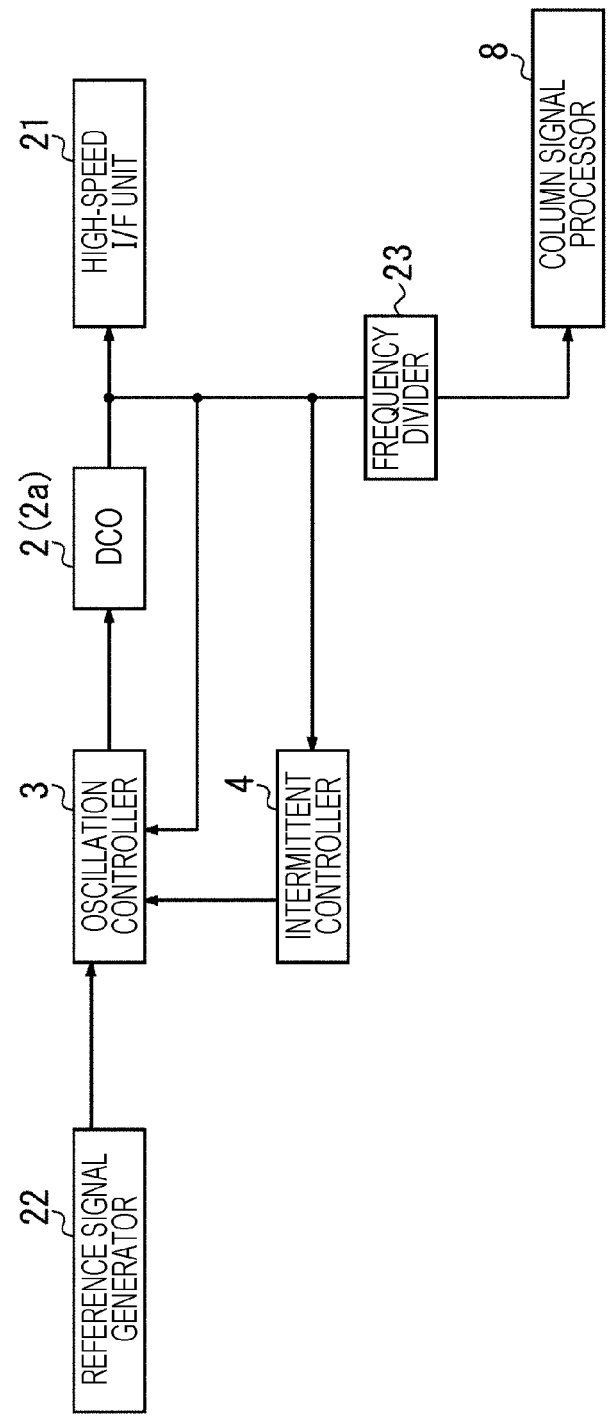
FIG. 8 is a block diagram showing a schematic configuration of a semiconductor integrated circuit as a first modification of the semiconductor integrated circuit in FIG. 7.

FIG. 8 is a block diagram showing a schematic configuration of a semiconductor integrated circuit 1*g* as a first modification of the semiconductor integrated circuit 1*f* in FIG. 7. The semiconductor integrated circuit 1*g* in FIG. 8 includes the DCO 2*a*, the oscillation controller 3, the intermittent controller 4, the column signal processor 8, the high-speed I/F unit 21, and a frequency divider 23.

The semiconductor integrated circuit 1*g* in FIG. 8 is different from the semiconductor integrated circuit 1*f* of FIG. 7 in that only one set of the DCO 2*a*, the oscillation controller 3, and the intermittent controller 4 is provided. The oscillation signal generated by the DCO 2*a* is supplied to the high-speed I/F unit 21 and used for signal transmission to the signal processing circuit 10. In addition, the oscillation signal generated by the DCO 2*a* is subjected to frequency division by the frequency divider 23 to generate a frequency-divided signal. This frequency-divided signal is supplied to the column signal processor 8 and used for the AD conversion processing.

In this way, the semiconductor integrated circuit 1*g* in FIG. 8 generates two types of oscillation signals by dividing the oscillation signal generated by the DCO 2*a* by the frequency divider 23. It is therefore not necessary to provide two sets of DCOs 2*b* and 2*c*, oscillation controllers 3*a* and 3*b*, and intermittent controllers 4*a* and 4*b* in the semiconductor integrated circuit 1*f*. Then, the internal configuration can be simplified, and low power consumption can be achieved.

In some cases, in addition to the signal processing circuit 10, a logic circuit is provided inside the semiconductor integrated circuit 1*e* of the imaging device 100 or the like. It is also conceivable that the logic circuit operates in synchronization with an oscillation signal having a frequency different from the frequency of the signal processing circuit 10.

Figure 9:
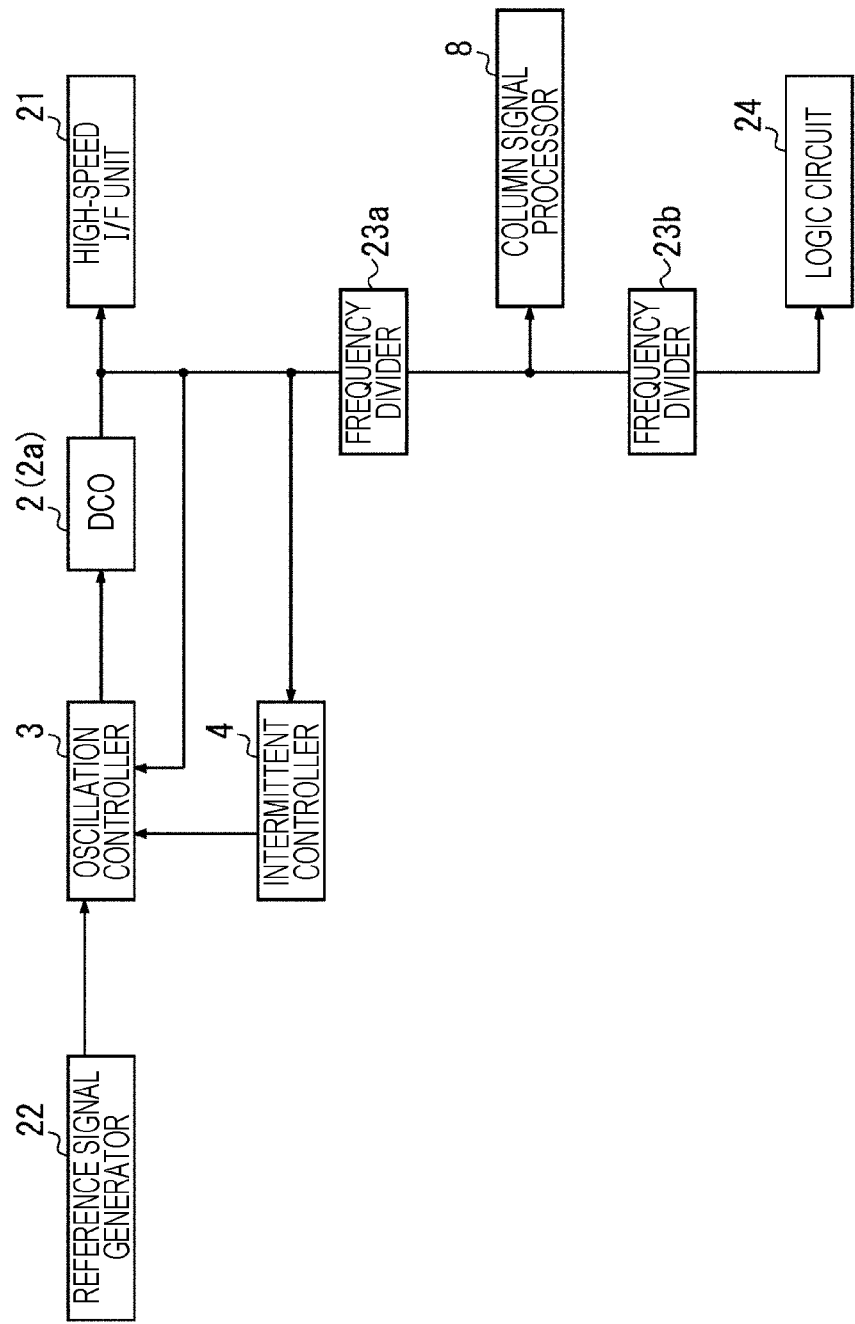
FIG. 9 is a block diagram showing a schematic configuration of a semiconductor integrated circuit as a second modification of the semiconductor integrated circuit in FIG. 7.

FIG. 9 is a block diagram showing a schematic configuration of a semiconductor integrated circuit 1*h* as a second modification of the semiconductor integrated circuit 1*f* in FIG. 7. The semiconductor integrated circuit 1*h* in FIG. 9 includes another frequency divider in addition to the configuration of the semiconductor integrated circuit 1*g* in FIG. 8. In FIG. 9, a first frequency divider 23*a* and a second frequency divider 23*b* are used to distinguish the two frequency dividers 23. In a similar manner to FIG. 8, the first frequency divider 23*a* generates a first frequency-divided signal used for the AD conversion processing by the column signal processor 8. The second frequency divider 23 further divides the first frequency-divided signal to generate a second frequency-divided signal. The second frequency-divided signal is used in a logic circuit 24.

Figure 10:
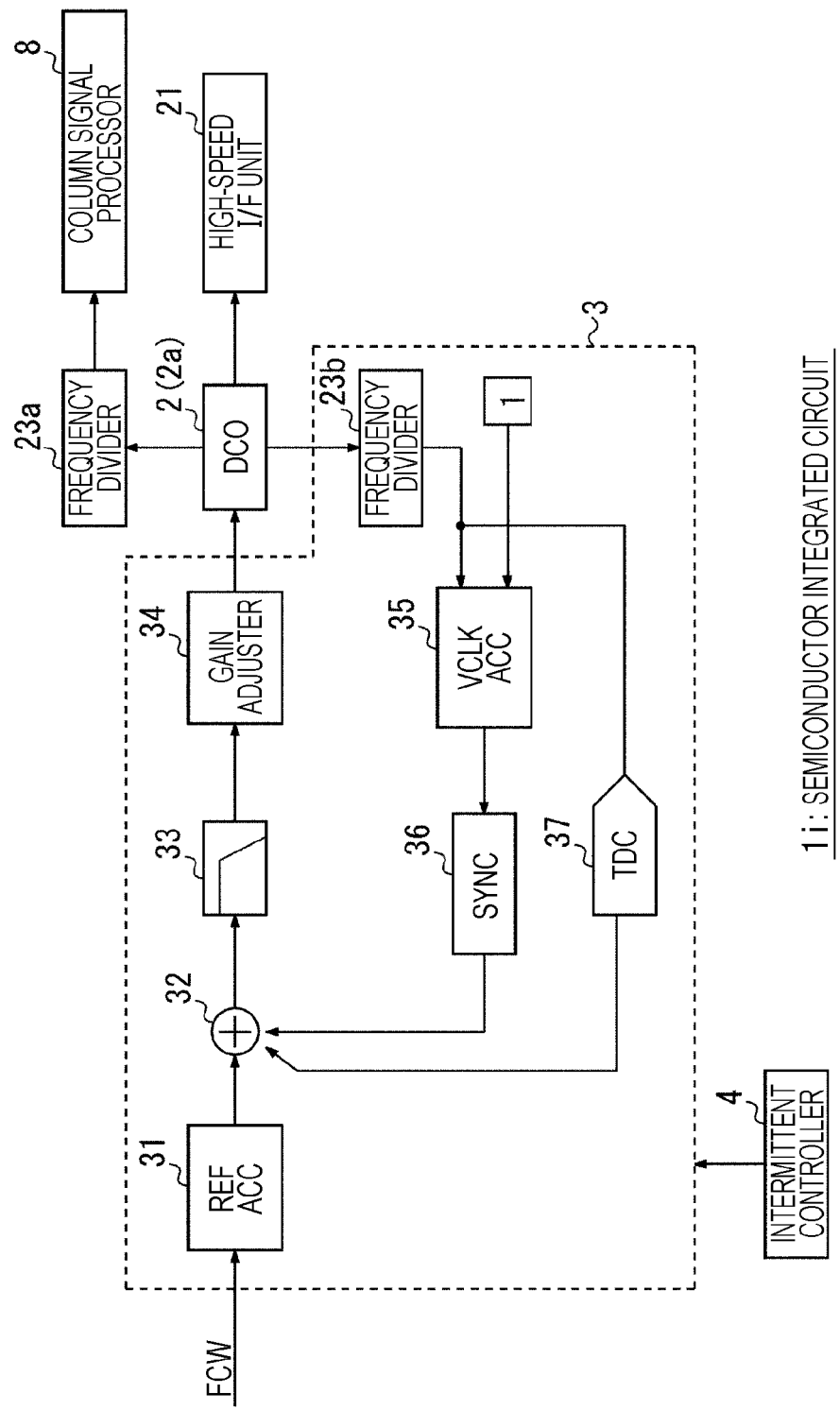
FIG. 10 is a block diagram of a semiconductor integrated circuit, specifically showing an internal configuration of an oscillation controller in the semiconductor integrated circuit in FIG. 8.

FIG. 10 is a block diagram of a semiconductor integrated circuit 1*i*, specifically showing the internal configuration of the oscillation controller 3 in the semiconductor integrated circuit 1*g* in FIG. 8. The oscillation controller 3 in FIG. 10 includes a reference accumulator (REFACC) 31, an adder 32, a low-pass filter 33, a gain adjustment unit 34, a clock accumulator (VCLKACC) 35, a synchronizer (SYNC) 36, and a time digital converter (TDC) 37.

The oscillation controller 3 performs feedback control of the oscillation frequency of the oscillation signal generated by the oscillator 2 (DCO 2*a*). In addition, the oscillation controller 3 intermittently controls the oscillation frequency of the DCO 2*a* on the basis of the intermittent control signal from the intermittent controller 4.

Figure 11:
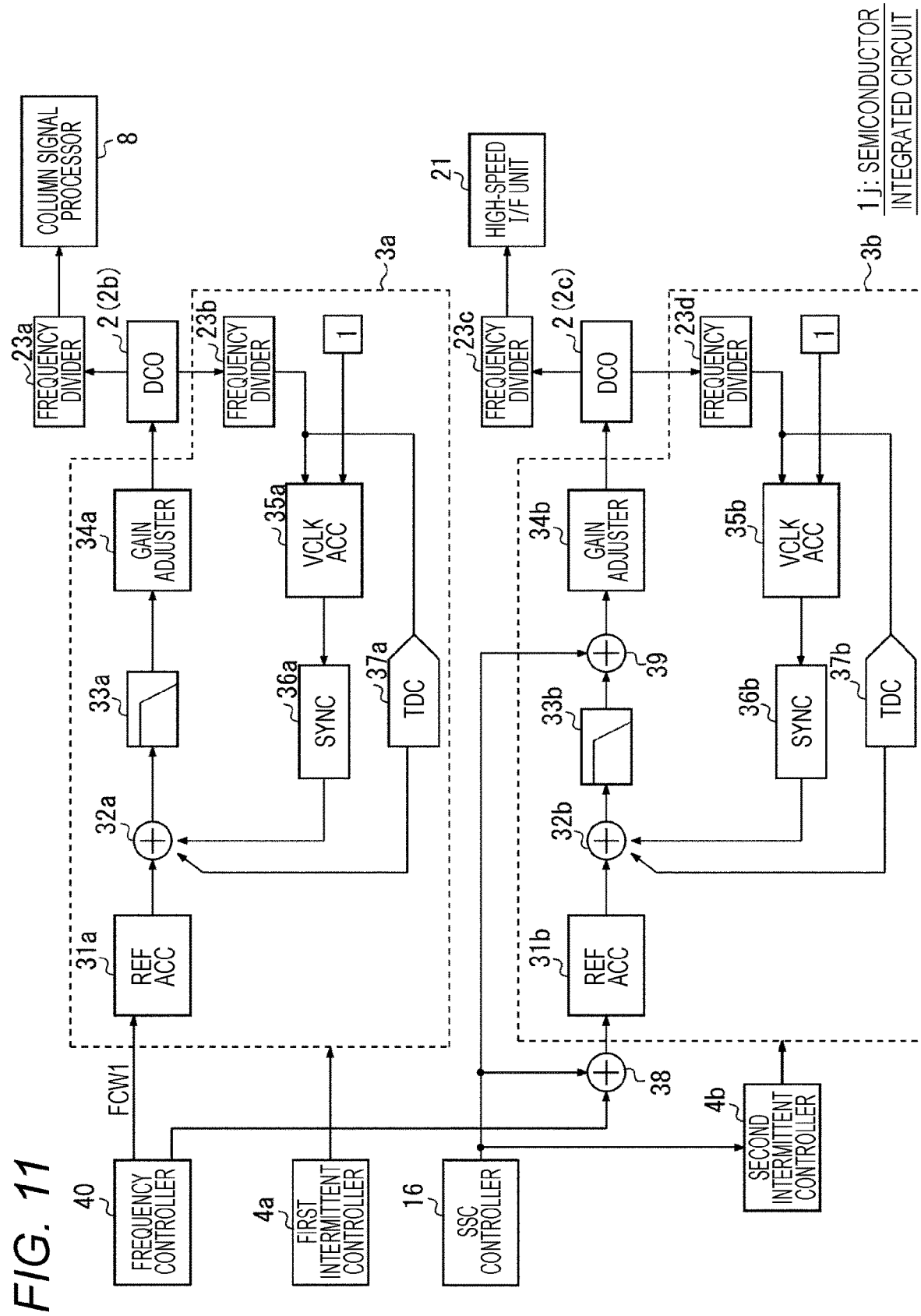
FIG. 11 is a block diagram of a semiconductor integrated circuit that inputs an SSC control signal from an SSC controller to a second oscillation controller in the semiconductor integrated circuit in FIG. 7.

FIG. 11 is a block diagram of a semiconductor integrated circuit 1*j* that inputs the SSC control signal from the SSC controller 16 to the second oscillation controller 3 in the semiconductor integrated circuit 1*f* in FIG. 7. The first oscillation controller 3*a* and the second oscillation controller 3*b* in FIG. 11 have a similar internal configuration to the oscillation controller 3 in FIG. 10, but the second oscillation controller 3*b* includes adders 38 and 39 in addition to the internal configuration of the first oscillation controller 3*a*.

The adder 38 in the second oscillation controller 3*b* is disposed on a preceding stage of the reference accumulator 31*b*. The adder 39 is disposed between a low-pass filter 33*b* and a gain adjuster 34b. The SSC control signal from the SSC controller 16 is supplied to the adders 38 and 39. The adder 38 on the preceding stage of the reference accumulator 31b adds an FCW signal output from a frequency controller 40 and the SSC control signal. The adder 39 between the low-pass filter 33b and the gain adjuster 34b adds an output signal of the low-pass filter 33b and the SSC control signal.

The internal configuration of the oscillation controller 3 (the first oscillation controller 3a and the second oscillation controller 3b) shown in FIGS. 10 and 11 is an example, and various modifications can be considered. In addition, although the SSC control signal is not input to the intermittent controller 4 in the semiconductor integrated circuits 1e, 1f, and 1g in FIGS. 7 to 9, the intermittent controller 4 may generate the intermittent control signal on the basis of the SSC control signal.

In this way, in the fourth embodiment, separate DCO 2a, oscillation controller 3, and intermittent controller 4 may be provided in association with a plurality of oscillation signals having different oscillation frequencies, or oscillation signals generated by a set of DCO 2a, oscillation controller 3, and intermittent controller 4 may be divided to generate a plurality of oscillation signals.

Fifth Embodiment

In a case where the semiconductor integrated circuits 1 to 1j according to the first to fourth embodiments are the imaging device 100, as shown in FIG. 3, the timing controller 11 in the imaging device 100 generates a horizontal synchronization signal and a vertical synchronization signal. The intermittent controller 4 can generate the intermittent control signal on the basis of at least one of the horizontal synchronization signal or the vertical synchronization signal.

Figure 12:
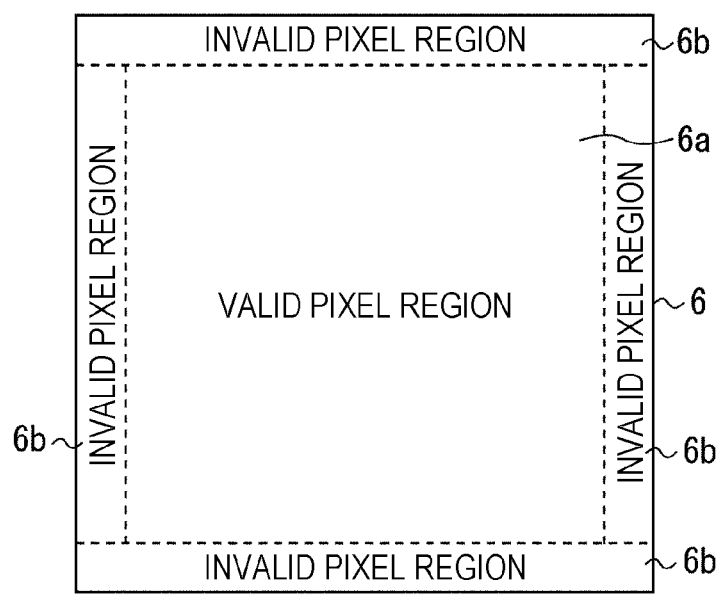
FIG. 12 is a schematic diagram showing a pixel array unit in an imaging device.

FIG. 12 is a schematic diagram showing the pixel array unit 6 in an imaging device 100. As shown in FIG. 12, the pixel array unit 6 includes a valid pixel region 6a and an invalid pixel region 6b. The invalid pixel region 6b is provided on both ends in a vertical direction and both ends in a horizontal direction of the valid pixel region 6a. In each pixel in the invalid pixel region 6b, effective photoelectric conversion is not performed. The vertical synchronization signal is output before the vertical scanner 7 starts scanning in the invalid pixel region 6b on an upper end in the vertical direction. Furthermore, the horizontal synchronization signal is output before a left end pixel of each pixel column extending in the horizontal direction is started to be driven.

FIG. 13A is a diagram showing output timings of the vertical synchronization signal and the horizontal synchronization signal and a period in which the oscillation controller 3 performs the PLL control of the oscillation frequency of the DCO 2a. The example of FIG. 13A shows an example in which the oscillation controller 3 performs the PLL control of the oscillation frequency of the DCO 2a only for a predetermined period to meet the timing at which the vertical synchronization signal is output. Specifically, in FIG. 13A, the oscillation controller 3 performs the PLL control of the oscillation frequency of the DCO 2a for a continuous predetermined period from immediately before the vertical synchronization signal is output to after the vertical synchronization signal is output. That is, in FIG. 13A, in the period of the invalid pixel region 6b and a part of the period of the valid pixel region 6a, the oscillation controller 3 performs the PLL control of the oscillation frequency of the DCO 2a only for a predetermined period in synchronization with the vertical synchronization signal.

Note that, in FIG. 13A, the oscillation controller 3 controls the oscillation frequency of the DCO 2a every time the vertical synchronization signal is output, but the oscillation controller 3 may control the oscillation frequency of the DCO 2a at a rate of once for a plurality of vertical synchronization signals.

FIG. 13B is a timing chart of a first modification of FIG. 13A. In the example of FIG. 13B, an example is shown in which the oscillation controller 3 performs the PLL control of the oscillation frequency of the DCO 2a only in a predetermined period to meet the timing at which the horizontal synchronization signal is output. Specifically, in FIG. 13B, the oscillation controller 3 performs the PLL control of the oscillation frequency of the DCO 2a in a continuous predetermined period from immediately before the horizontal synchronization signal is output to after the horizontal synchronization signal is output. In FIG. 13B, in the period of the invalid pixel region 6b and a part of the period of the valid pixel region 6a, the oscillation controller 3 performs the PLL control of the oscillation frequency of the DCO 2a only for a predetermined period in synchronization with the horizontal synchronization signal.

Note that, in FIG. 13B, the oscillation controller 3 controls the oscillation frequency of the DCO 2a every time the horizontal synchronization signal is output, but the oscillation controller 3 may control the oscillation frequency of the DCO 2a at a rate of once for a plurality of horizontal synchronization signals.

It is also possible to implement a combination of FIGS. 13A and 13B. That is, the oscillation controller 3 may control the oscillation frequency of the DCO 2a in synchronization with the vertical synchronization signal and the horizontal synchronization signal. At that time, the oscillation controller 3 may control the oscillation frequency of the DCO 2a at a rate of once for the plurality of vertical synchronization signals and horizontal synchronization signals.

Figure 14A:
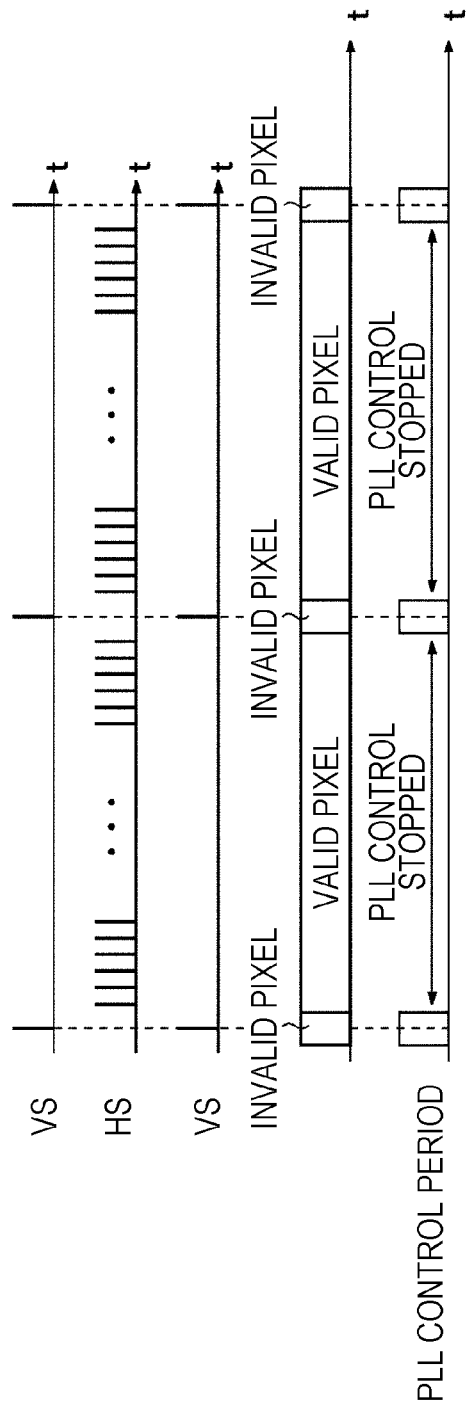
FIG. 14A is a timing chart of a second modification of FIG. 13A.

Various modifications are conceivable as the period and timing in which the oscillation controller 3 performs the PLL control of the oscillation frequency of the DCO 2a. FIG. 14A is a timing chart of a second modification of FIG. 13A. In FIG. 14A, the oscillation controller 3 performs the PLL control of the oscillation frequency of the DCO 2a only in the period of the invalid pixel region 6b to meet the output timing of the vertical synchronization signal. Through the PLL control of the oscillation frequency only in the period of the invalid pixel region 6b, noise caused by the PLL loop in the oscillation controller 3 does not appear in the imaging signal in the valid pixel region 6a, and the quality of captured images can be improved. In FIG. 14A, the oscillation controller 3 controls the oscillation frequency of the DCO 2a every time the vertical synchronization signal is output, but the oscillation controller 3 may control the oscillation frequency of the DCO 2a at a rate of once for a plurality of vertical synchronization signals.

FIG. 14B is a timing chart of a third modification of FIG. 13A. In FIG. 14B, the oscillation controller 3 performs the PLL control of the oscillation frequency of the DCO 2a only in the period of the invalid pixel region 6b to meet the output timing of the horizontal synchronization signal. By the PLL controlling of the oscillation frequency only in the period of the invalid pixel region 6b, noise caused by the PLL loop in the oscillation controller 3 does not appear in the imaging signal in the valid pixel region 6a. In FIG. 14B, too, the oscillation controller 3 may control the oscillation frequency of the DCO 2a at a rate of once for a plurality of horizontal synchronization signals.

Figure 15A:
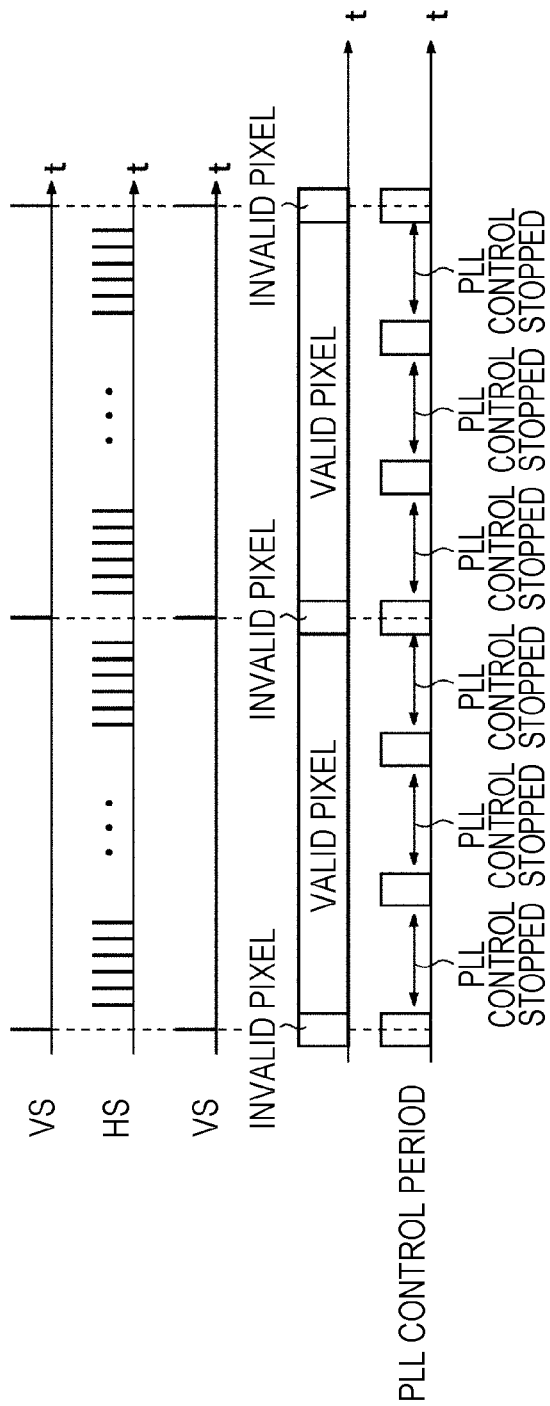
FIG. 15A is a timing chart of a fourth modification of FIG. 13A.

FIG. 15A is a timing chart of a fourth modification of FIG. 13A. In FIG. 15A, the oscillation controller 3 performs the PLL control of the oscillation frequency of the DCO 2a in the period of the invalid pixel region 6b and a plurality of separate periods in the valid pixel region 6a to meet the output timing of the horizontal synchronization signal. In the valid pixel region 6a, the length of the period in which the oscillation controller 3 performs the PLL control of the oscillation frequency of the DCO 2a is arbitrary, and the length of this period may be adjustable. In FIG. 15A, too, the oscillation controller 3 may control the oscillation frequency of the DCO 2a in the period of the invalid pixel region 6b and a plurality of separate periods in the valid pixel region 6a at a rate of once for a plurality of vertical synchronization signals.

Figure 15B:
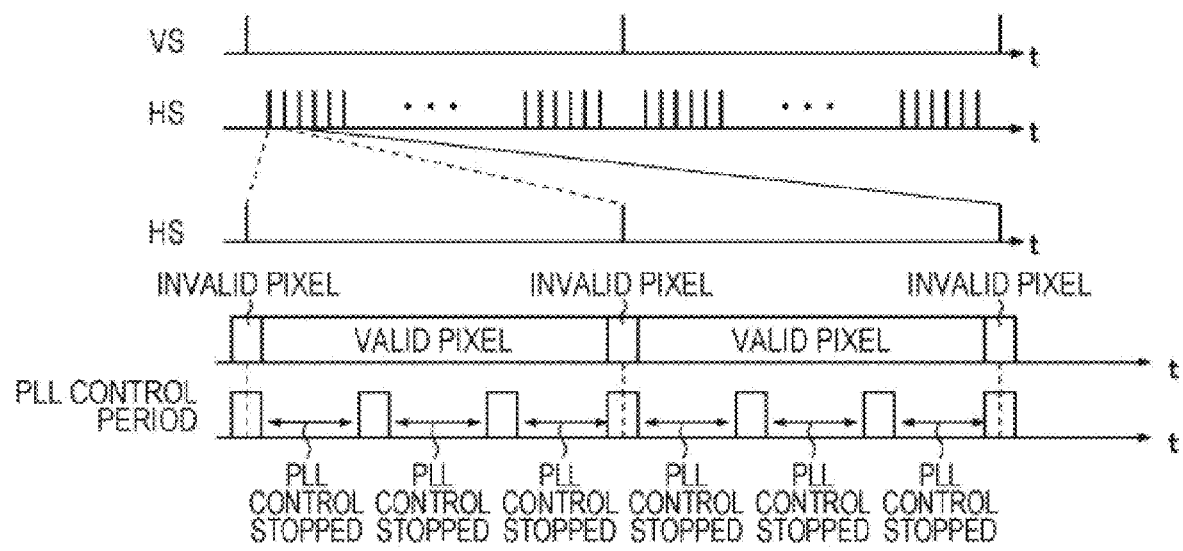
FIG. 15B is a timing chart of a fifth modification of FIG. 13A.

FIG. 15B is a timing chart of a fifth modification of FIG. 13A. In FIG. 15B, the oscillation controller 3 performs the PLL control of the oscillation frequency of the DCO 2a in the period of the invalid pixel region 6b and a plurality of separate periods in the valid pixel region 6a to meet the output timing of the horizontal synchronization signal. In the valid pixel region 6a, the length of the period in which the oscillation controller 3 performs the PLL control of the oscillation frequency of the DCO 2a is arbitrary, and the length of this period may be adjustable. In FIG. 15B, too, the oscillation controller 3 may control the oscillation frequency of the DCO 2a in the period of the invalid pixel region 6b and a plurality of separate periods in the valid pixel region 6a at a rate of once for a plurality of horizontal synchronization signals.

In this way, in the fifth embodiment, since the intermittent control signal is generated on the basis of at least one of the vertical synchronization signal or the horizontal synchronization signal generated by the timing controller 11 in the imaging device 100, the period and timing in which the oscillation controller 3 intermittently controls the oscillation frequency of the DCO 2a can be easily set.

Sixth Embodiment

In a sixth embodiment, an intermittent control signal is generated in synchronization with an SSC control signal.

Figure 16A:
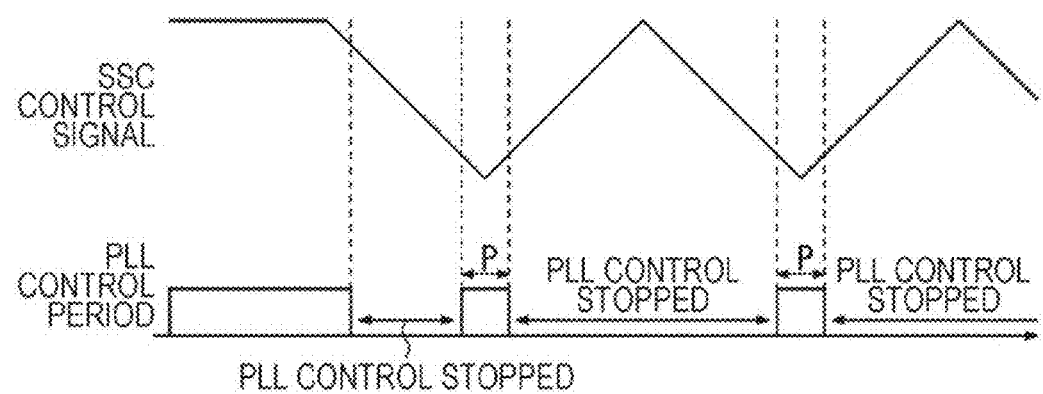
FIG. 16A is a diagram showing the SSC control signal and a timing at which the oscillation controller performs the PLL control of the oscillation frequency of the DCO.

FIG. 16A is a diagram showing the SSC control signal and a timing at which the oscillation controller 3 performs the PLL control of the oscillation frequency of the DCO 2a. As shown in FIG. 16A, the SSC control signal is, for example, a triangular wave signal, and a voltage level of the SSC control signal continuously changes with time. In the example of FIG. 16A, the oscillation controller 3 performs the PLL control of the oscillation frequency of the DCO 2a to meet a valley position of the SSC control signal. Specifically, the oscillation controller 3 performs the PLL control of the oscillation frequency only for a predetermined period P before and after the valley position of the SSC control signal. In addition, the oscillation controller 3 continuously performs the PLL control of the oscillation frequency of the DCO 2a in a period in which the SSC control signal maintains a high level, that is, when the SSC control is not performed. The length of the predetermined period P for performing the PLL control may be adjustable.

Note that, instead of performing the PLL control at every valley position of the SSC control signal, the oscillation controller 3 may perform the PLL control of the oscillation frequency of the DCO 2a at a rate of once for a plurality of valley positions of the SSC control signal.

Figure 16B:
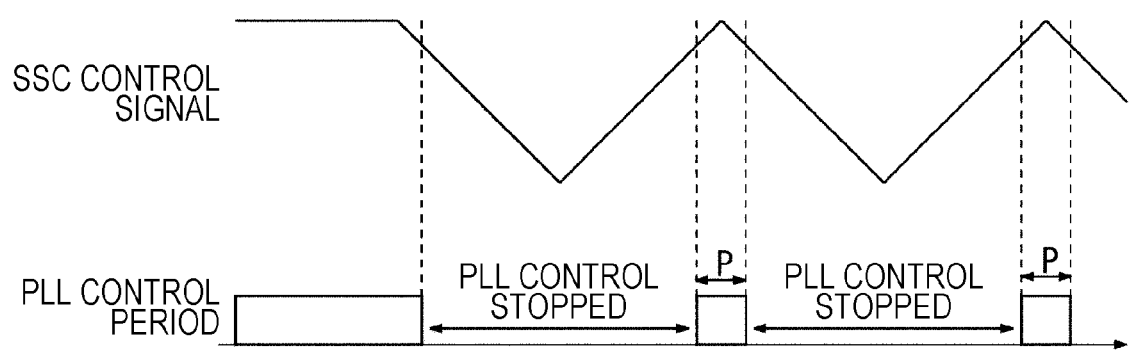
FIG. 16B is a diagram showing a first modification of FIG. 16A.

FIG. 16B is a diagram showing a first modification of FIG. 16A. In the example of FIG. 16B, the oscillation controller 3 performs the PLL control of the oscillation frequency of the DCO 2a to meet a peak position of the SSC control signal. Specifically, the oscillation controller 3 performs the PLL control of the oscillation frequency only for a predetermined period P before and after the peak position of the SSC control signal. Note that, instead of performing the PLL control at every peak position of the SSC control signal, the oscillation controller 3 may perform the PLL control of the oscillation frequency of the DCO 2a at a rate of once for a plurality of peak positions of the SSC control signal. In FIG. 16B, too, the length of the predetermined period P for performing the PLL control may be adjustable.

Figure 16C:
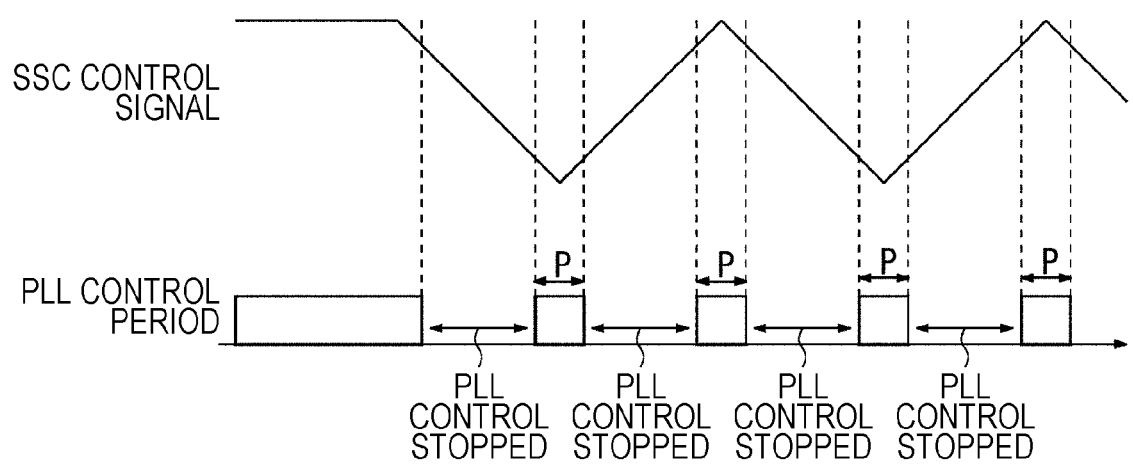
FIG. 16C is a diagram showing a second modification of FIG. 16A.

FIG. 16C is a diagram showing a second modification of FIG. 16A. In the example of FIG. 16C, the oscillation controller 3 performs the PLL control of the oscillation frequency of the DCO 2a to meet the peak position and the valley position of the SSC control signal. Specifically, the oscillation controller 3 performs the PLL control of the oscillation frequency only for a predetermined period P before and after the peak position and the valley position of the SSC control signal. Note that, instead of performing the PLL control at every peak position and valley position of the SSC control signal, the oscillation controller 3 may perform the PLL control of the oscillation frequency of the DCO 2a at a rate of once for a plurality of peak positions of the SSC control signal. In FIG. 16C, too, the length of the predetermined period P for performing the PLL control may be adjustable.

In this way, in the sixth embodiment, since the intermittent control signal is generated by using at least one of the valley position or the peak position of the SSC control signal as a reference, the period and timing in which the oscillation controller 3 controls the oscillation frequency of the DCO 2a can be easily set.

Seventh Embodiment

A semiconductor integrated circuit 1k according to a seventh embodiment is a modification of the semiconductor integrated circuit 1f according to the fourth embodiment.

FIG. 17 is a block diagram showing a schematic configuration of the semiconductor integrated circuit 1k according to the seventh embodiment. The semiconductor integrated circuit 1k in FIG. 17 includes a column signal processing controller 17 and a high-speed I/F controller 18 in addition to the configuration in FIG. 7.

The column signal processing controller 17 controls a timing at which the first intermittent controller 4a generates the first intermittent control signal in conjunction with switching of an operation mode of the column signal processor 8.

The high-speed I/F controller 18 controls a timing at which the second intermittent controller 4b generates the second intermittent control signal in conjunction with switching of an operation mode of the high-speed I/F unit 21.

As will be described later, the high-speed I/F unit 21 performs high-speed serial communication in compliance with, for example, standards of Automotive SerDes Appliance (ASA). In the ASA standard, uplink serial transmission and downlink serial transmission are switched in a time division manner. Thus, the high-speed I/F controller 18 controls a timing at which the second intermittent controller 4b generates the second intermittent control signal in conjunction with the timing at which uplink and downlink are switched. For example, the second oscillation controller 3b controls the PLL of the second oscillation signal during an uplink period, and the second oscillation controller 3*b* stops the PLL control of the second oscillation signal during a downlink period.

FIG. 18 is a block diagram showing a schematic configuration of a semiconductor integrated circuit 1*m* as a first modification of the semiconductor integrated circuit 1*k* in FIG. 17. The semiconductor integrated circuit 1*m* in FIG. 18 includes the high-speed I/F controller 18 and the column signal processing controller 17 in addition to the configuration in FIG. 8.

The high-speed I/F controller 18 controls a timing at which the intermittent controller 4 generates the intermittent control signal in conjunction with switching of an operation mode of the high-speed I/F unit 21. The column signal processing controller 17 intermittently controls the frequency divider in conjunction with switching of the operation mode of the column signal processor 8.

FIG. 19 is a block diagram showing a schematic configuration of a semiconductor integrated circuit 1*n* as a second modification of the semiconductor integrated circuit 1*k* in FIG. 17. The semiconductor integrated circuit 1*n* in FIG. 19 includes the high-speed I/F controller 18, the column signal processing controller 17, and a logic circuit controller 19 in addition to the configuration in FIG. 9.

The high-speed I/F controller 18 controls a timing at which the intermittent controller 4 generates the intermittent control signal in conjunction with switching of an operation mode of the high-speed I/F unit 21. The column signal processing controller 17 intermittently controls the frequency divider in conjunction with switching of the operation mode of the column signal processor 8. The logic circuit controller 19 intermittently controls the frequency divider in conjunction with switching of an operation mode of the logic circuit 24.

In this way, the high-speed I/F controller 18 according to the seventh embodiment controls the timing of the intermittent control signal (second intermittent control signal) in conjunction with the switching of the operation mode of the high-speed I/F unit 21. It is therefore possible to switch whether or not to perform the PLL control of the oscillation frequency of the DCO 2 (second DCO 2*c*) in accordance with the switching of the operation mode of the high-speed I/F unit 21, and it is possible to reduce more power consumption than in a case where the oscillation frequency of the DCO 2 (second DCO 2*c*) is always PLL controlled.

Eighth Embodiment

A semiconductor integrated circuit according to an eighth embodiment is a modification of the semiconductor integrated circuit according to the fifth embodiment.

Figure 20:
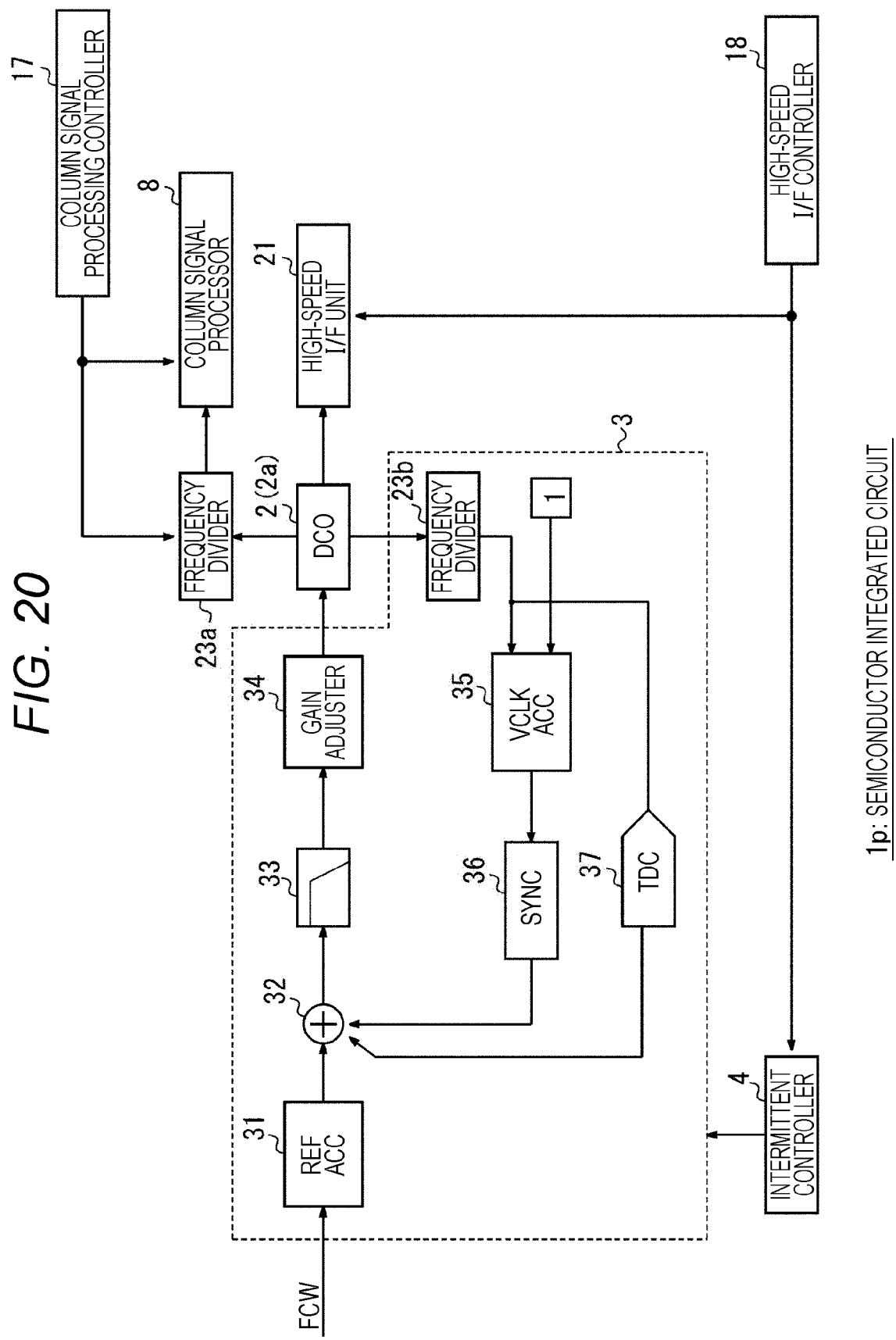
FIG. 20 is a block diagram showing a schematic configuration of a semiconductor integrated circuit according to an eighth embodiment.

FIG. 20 is a block diagram showing a schematic configuration of a semiconductor integrated circuit 1*p* according to the eighth embodiment. The semiconductor integrated circuit 1*p* in FIG. 20 includes the column signal processing controller 17 and the high-speed I/F controller 18 in addition to the configuration in FIG. 10. The column signal processing controller 17 intermittently controls the frequency divider in conjunction with switching of the operation mode of the column signal processor 8. The high-speed I/F controller 18 controls a timing at which the intermittent controller 4 generates the intermittent control signal in conjunction with switching of an operation mode of the high-speed I/F unit 21.

Figure 21:
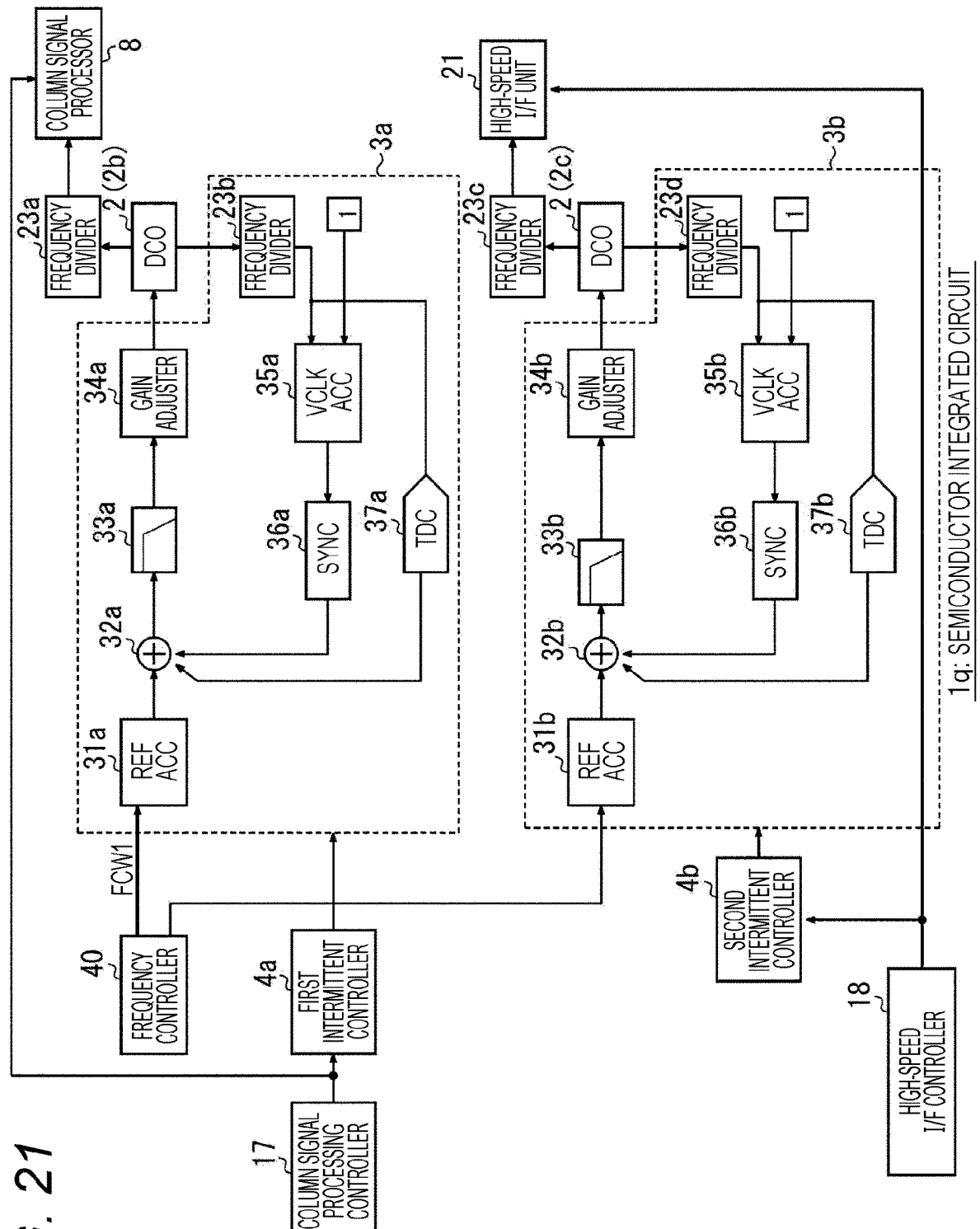
FIG. 21 is a block diagram showing a schematic configuration of a semiconductor integrated circuit according to a modification of the eighth embodiment.

FIG. 21 is a block diagram showing a schematic configuration of a semiconductor integrated circuit 1*q* according to a modification of the eighth embodiment. The semiconductor integrated circuit 1*q* in FIG. 21 has a configuration in which the SSC controller is omitted from the configuration in FIG. 11 and the column signal processing controller 17 and the high-speed I/F controller 18 are added.

The column signal processing controller 17 in FIG. 21 controls the timing at which the first intermittent controller 4*a* generates the first intermittent control signal in conjunction with switching of the operation mode of the column signal processor 8. The high-speed I/F controller 18 controls a timing at which the second intermittent controller 4*b* generates the second intermittent control signal in conjunction with switching of an operation mode of the high-speed I/F unit 21.

In this way, in the eighth embodiment, the DCO 2 (the first DCO 2*b* and the second DCO 2*c*) can be intermittently operated in conjunction with the switching of the operation modes of the column signal processor 8 and the high-speed I/F unit 21, and the power consumption can be reduced.

Ninth Embodiment

A ninth embodiment specifically indicates a switching timing of the operation mode of the high-speed I/F unit 21 in the seventh and eighth embodiments described above.

Figure 22A:
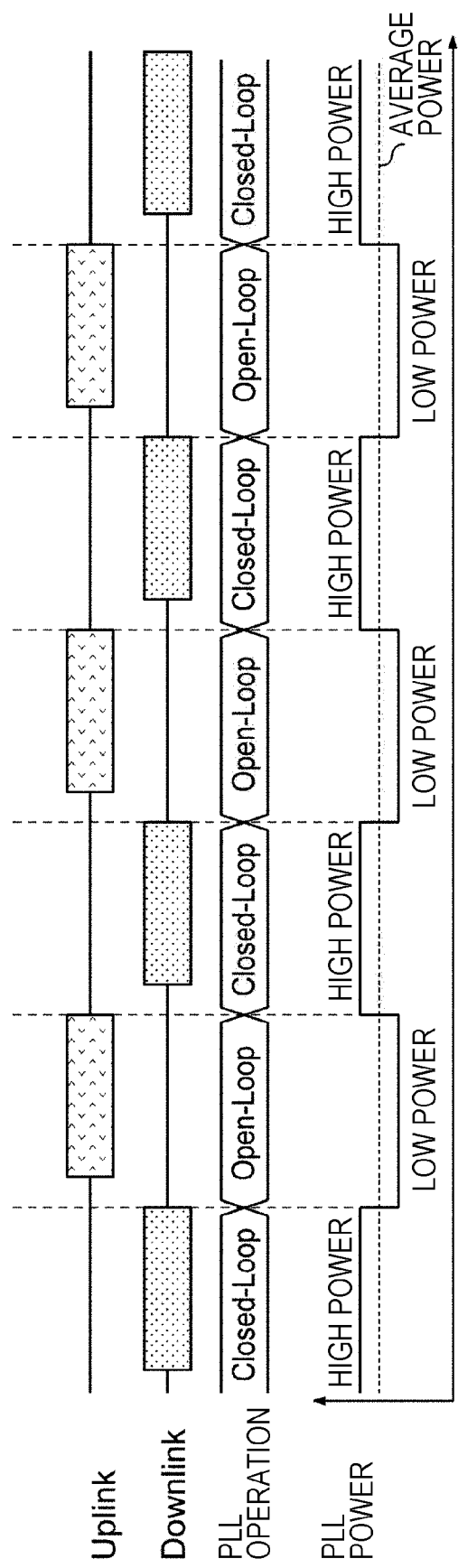
FIG. 22A is a timing chart showing a first example of switching of an operation mode of a high-speed I/F unit according to a ninth embodiment.

FIG. 22A is a timing chart showing a first example of the switching the operation mode of the high-speed I/F unit 21 according to the ninth embodiment. In the first example, in the operation mode in which the high-speed I/F unit 21 performs uplink transmission (hereinafter, a first operation mode), the DCO 2 (second DCO 2*c*) that generates the oscillation signal used in the high-speed I/F unit 21 is not under the PLL control, and in the operation mode in which the high-speed I/F unit 21 performs downlink transmission (hereinafter, a second operation mode), the DCO 2 (second DCO 2*c*) is under the PLL control. Performing the PLL control of the DCO 2 (second DCO 2*c*) may be herein referred to as closed loop operation, and not performing the PLL control of the DCO 2 (second DCO 2*c*) may be herein referred to as open loop operation. The closed loop operation consumes more power than the open loop operation, but can stabilize the frequency and phase of the oscillation signal generated by the DCO 2 (second DCO 2*c*).

In the example of FIG. 22A, the open loop operation is always performed in the first operation mode in which the uplink transmission is performed, and the closed loop operation is always performed in the second operation mode in which the downlink transmission is performed. Therefore, during uplink transmission, more power consumption can be reduced than during downlink transmission. In addition, in the example of FIG. 22A, since an uplink transmission period and a downlink transmission period are substantially equal, the power consumption required for the PLL control can be reduced by about half as compared with the case where the DCO 2 (second DCO 2*c*) is always under the PLL control.

Note that, in contrast to FIG. 22A, the closed loop operation may be always performed in the first operation mode in which the uplink transmission is performed, and the open loop operation may be always performed in the second operation mode in which the downlink transmission is performed.

Figure 22B:
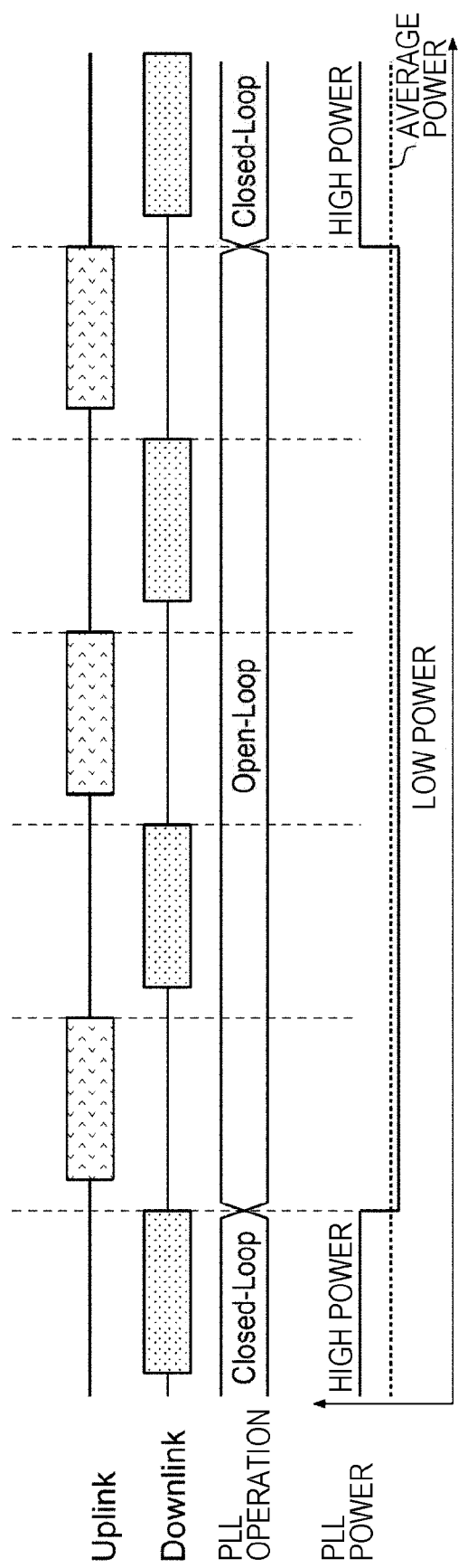
FIG. 22B is a timing chart showing a second example of the switching of the operation mode of the high-speed I/F unit according to the ninth embodiment.

FIG. 22B is a timing chart showing a second example of the switching the operation mode of the high-speed I/F unit 21 according to the ninth embodiment. In the second example, the period of the open loop operation is longer than the period of the closed loop operation. As shown in the drawing, a plurality of times of uplink transmission and downlink transmission are alternately performed during the period of the open loop operation. FIG. 22B shows an example in which the second operation mode in which downlink transmission is performed during the period of the closed loop operation is selected. However, the second operation mode in which uplink transmission is performed during the period of the closed loop operation may be selected. Alternatively, the second operation mode in which downlink transmission is performed and the first operation mode in which uplink transmission is performed during the period of the closed loop operation may be alternately selected.

In the second example in FIG. 22B, more power consumption can be reduced than in the first example in FIG. 22A, but the oscillation frequency and the phase of the oscillation signal of the DCO 2 (second DCO 2c) are likely to be shifted.

In both of FIGS. 22A and 22B, the closed loop operation and the open loop operation of the DCO 2 (second DCO 2c) are switched in conjunction with switching between the first operation mode in which the high-speed I/F unit performs uplink transmission and the second operation mode in which the high-speed I/F unit 21 performs downlink transmission. It is therefore possible to perform the uplink transmission and the downlink transmission without being affected by noise or the like that can occur when the closed loop operation and the open loop operation of the DCO 2 (second DCO 2c) are switched.

Figure 23A:
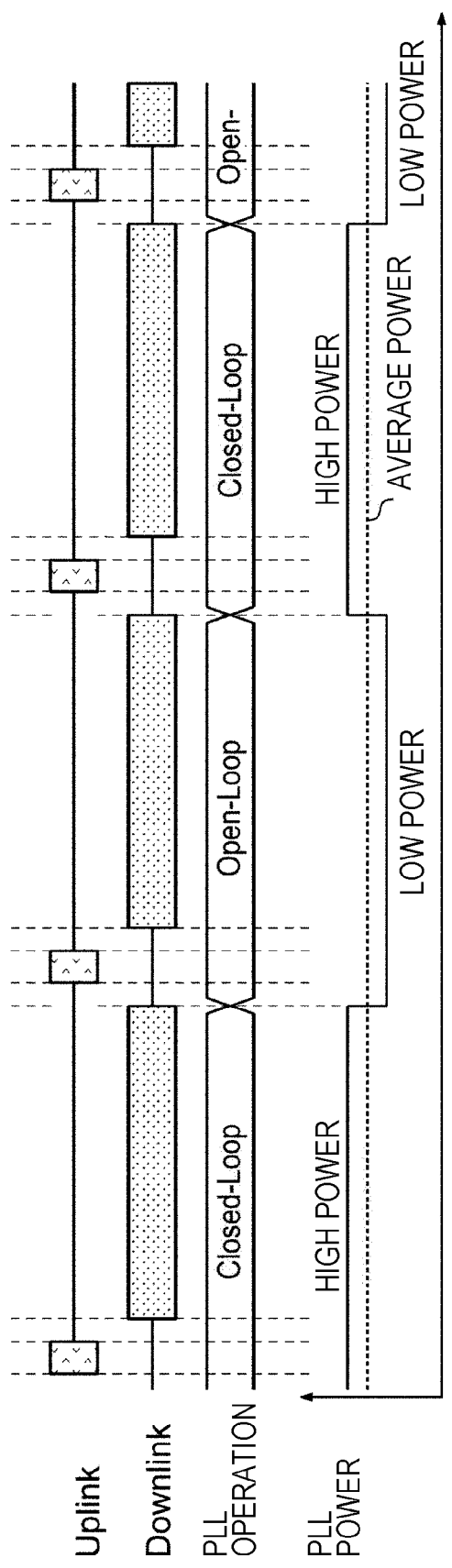
FIG. 23A is a timing chart showing a third example of the switching of the operation mode of the high-speed I/F unit according to the ninth embodiment.
Figure 23B:
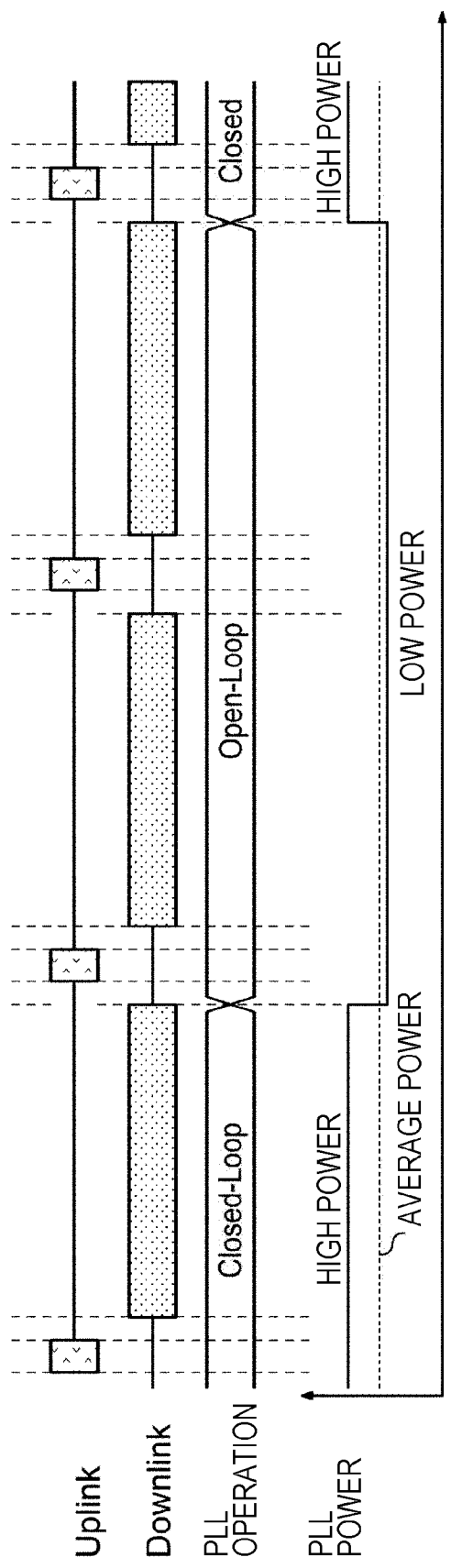
FIG. 23B is a timing chart showing a fourth example of the switching of the operation mode of the high-speed I/F unit according to the ninth embodiment.
Figure 23C:
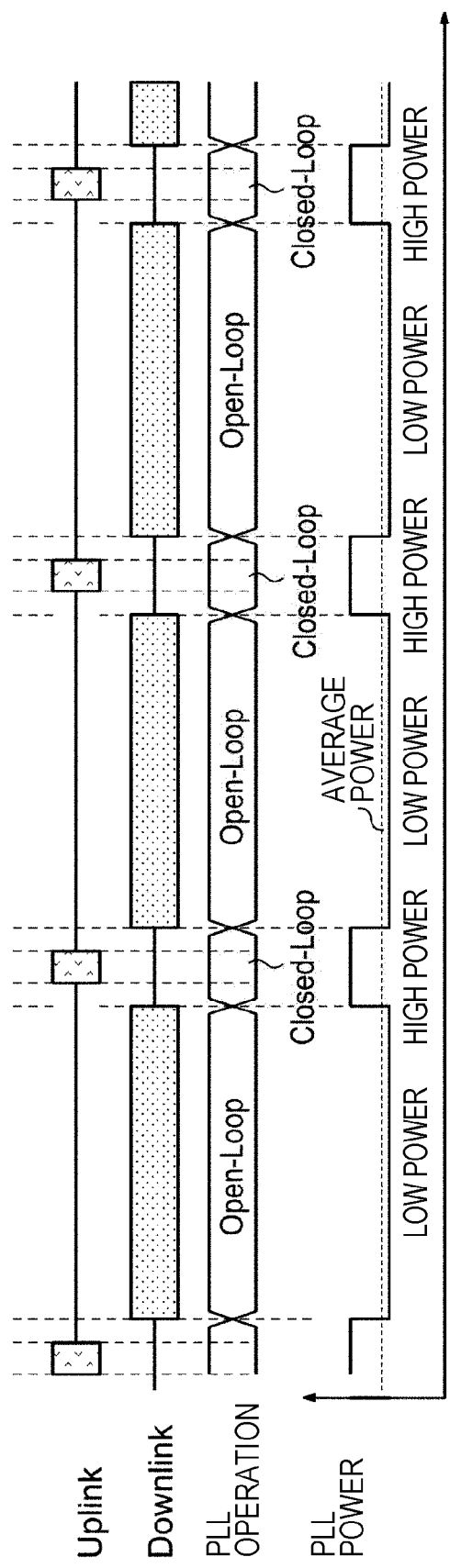
FIG. 23C is a timing chart showing a fifth example of the switching of the operation mode of the high-speed I/F unit according to the ninth embodiment.

FIGS. 23A, 23B, and 23C are timing charts showing a third example, a fourth example, and a fifth example of the switching of the operation mode of the high-speed I/F unit 21 according to the ninth embodiment. FIGS. 23A, 23B, and 23C show examples in which, in a case where the uplink transmission period of the high-speed I/F unit 21 is shorter than the downlink transmission period, the closed loop operation and the open loop operation of the DCO 2 (second DCO 2c) are switched in conjunction with the switching timing of the uplink transmission and the down transmission.

FIG. 23A shows an example in which the closed loop operation and the open loop operation of the DCO 2 (second DCO 2c) are switched in conjunction with the timing at which the high-speed I/F unit 21 switches between the first operation mode for performing uplink transmission and the second operation mode for performing downlink transmission. Therefore, a case of performing the closed loop operation and a case of performing the open loop operation are alternately switched between the uplink transmission period and the downlink transmission period.

FIG. 23B shows an example in which the open loop operation of the DCO 2 (second DCO 2c) is continuously performed during a plurality of uplink transmission periods and downlink transmission periods, and the open loop operation period is longer than the closed loop period. In the fourth example in FIG. 23B, more power consumption can be reduced than in the third example in FIG. 23A.

FIG. 23C shows an example in which the closed loop operation is performed in a period of the first operation mode in which the uplink transmission is performed, and the open loop operation is performed in a period of the second operation mode in which the downlink transmission is performed. Since the uplink period is shorter than the downlink period, by performing the closed loop operation only for the uplink period, more power consumption can be reduced than in the third example in FIG. 23A and the fourth example in FIG. 23B.

Note that, in a case where it is desired to suppress the shift of the oscillation frequency and the phase of the oscillation signal of the DCO 2 (second DCO 2c) as much as possible, the open loop operation may be performed in the uplink period, and the closed loop operation may be performed in the downlink period.

Figure 24:
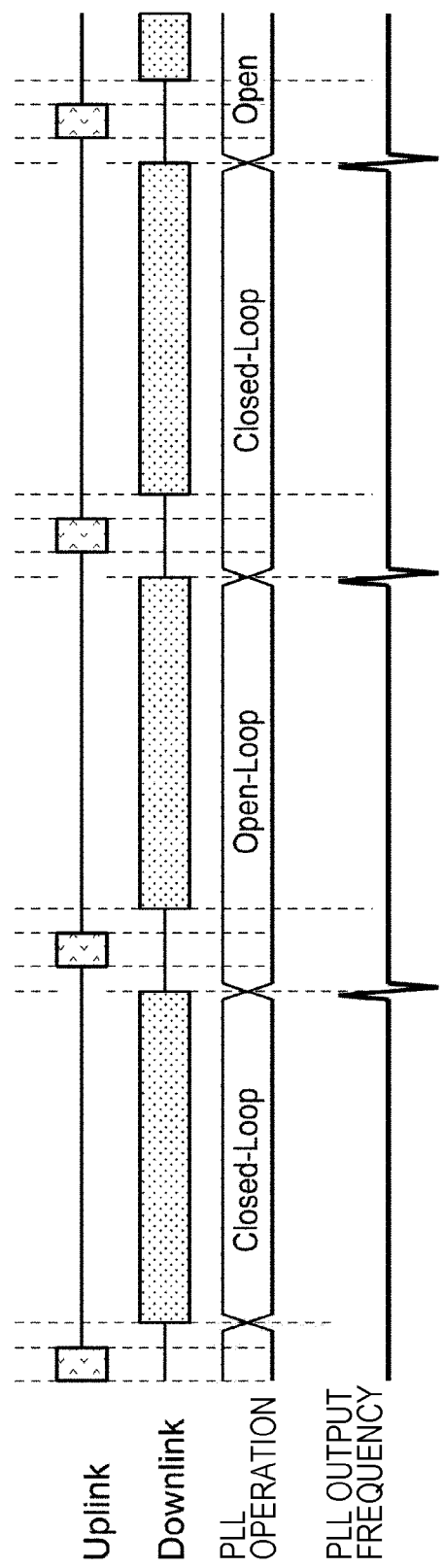
FIG. 24 is a diagram showing a state in which the oscillation frequency of the oscillation signal transiently fluctuates when a closed loop operation and an open loop operation of a DCO 2 (second DCO 2c) are switched.

FIG. 24 is a diagram showing a state in which the oscillation frequency of the oscillation signal transiently fluctuates when the closed loop operation and the open loop operation of the DCO 2 (second DCO 2c) are switched. In the above first to fifth examples shown in FIGS. 22A, 22B, 23A, 23B, and 23C, the closed loop operation and the open loop operation are switched in conjunction with the switching timing between the first operation mode for performing the uplink transmission and the second operation mode for performing the downlink transmission. Therefore, even if the oscillation frequency transiently fluctuates as shown in FIG. 24 when the DCO 2 (second DCO 2c) switches between the closed loop operation and the open loop operation, there is no possibility of adversely affecting the uplink transmission and the downlink transmission, and the power consumption can be reduced while the signal can be transmitted stably.

In this way, in the ninth embodiment, in a case where the high-speed I/F unit 21 alternately switches between the uplink transmission and the downlink transmission, the closed loop operation and the open loop operation of the DCO 2 (second DCO 2c) that supplies the oscillation signal to the high-speed I/F unit 21 are switched in conjunction with the switching between the uplink transmission and the downlink transmission. As a result, power consumption at the time of signal transmission via the high-speed I/F unit 21 can be reduced, and even if noise occurs at the time of switching between the closed loop operation and the open loop operation, the signal can be transmitted without being affected by the noise.

Tenth Embodiment

Figure 25A:
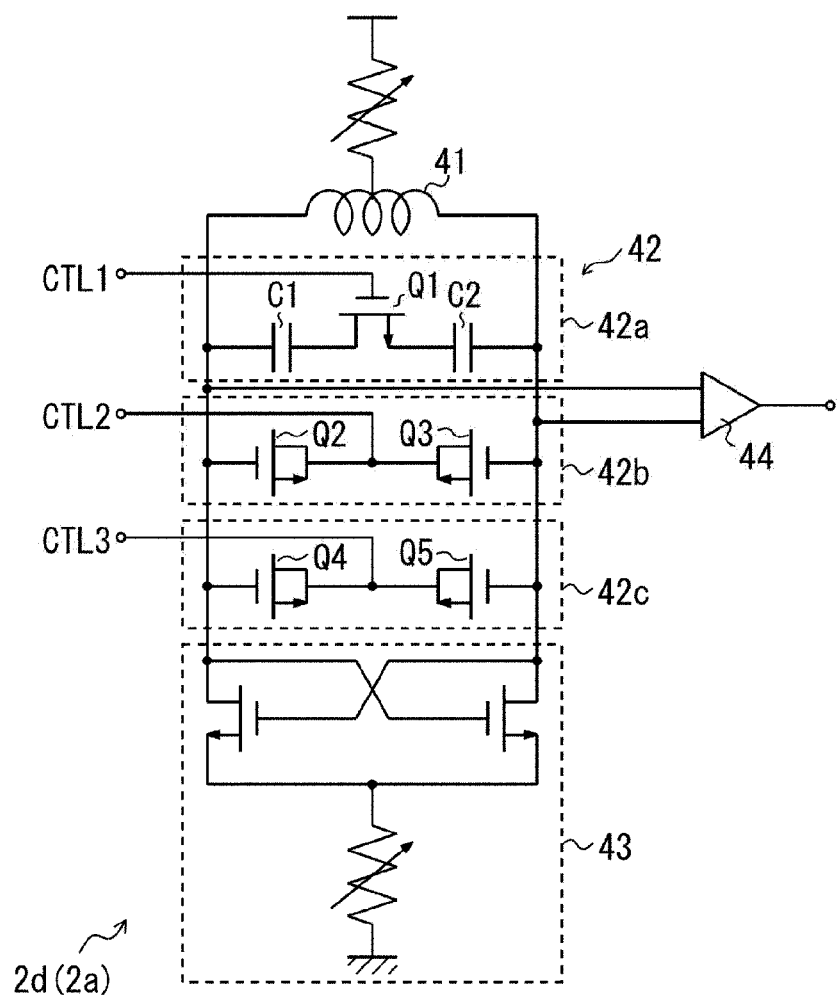
FIG. 25A is a circuit diagram showing a first example of an internal configuration of the DCO.

A plurality of internal configurations of the DCO 2a in the semiconductor integrated circuit 1 to 1q according to the first to ninth embodiments described above is conceivable. FIG. 25A is a circuit diagram showing a first example of the internal configuration of the DCO 2a. A DCO 2d in FIG. 25A includes an inductor 41, a variable capacitance unit 42, a negative resistance generator 43, and an output amplifier 44.

The variable capacitance unit 42 includes a plurality of variable capacitance element groups 42a, 42b, and 42c connected in parallel. Corresponding control signals CTL1, CTL2, and CTL3 are input to the plurality of variable capacitance element groups 42a, 42b, and 42c, respectively. By adjusting the voltages of the control signals CTL1, CTL2, and CTL3, the capacitances of the corresponding variable capacitance element groups 42a, 42b, and 42c can be variably controlled. The internal configurations of the plurality of variable capacitance element groups 42a, 42b, and 42c are not necessarily the same. In the example in FIG. 25A, in the variable capacitance element group 42a, a first capacitor C1, a MOS transistor Q1, and a second capacitor C2 are connected in series, and the overall capacitance can be variably controlled by adjusting a control signal input to a gate of the MOS transistor Q1. In the variable capacitance element groups 42b and 42c, the drains and sources of the two MOS transistors Q2 and Q3 or the transistors Q4 and Q5 are short-circuited, and the overall capacitance can be variably controlled by controlling the control signals CTL2 and CTL3 input to the short-circuited nodes.

In FIG. 25A, three variable capacitance element groups 42a, 42b, and 42c are connected in parallel, the variable capacitance element group 42a is used to set a target oscillation frequency, the variable capacitance element group 42b is used to perform coarse adjustment of the oscillation frequency, and the variable capacitance element group 42c is used to perform fine adjustment of the oscillation frequency.

Figure 25B:
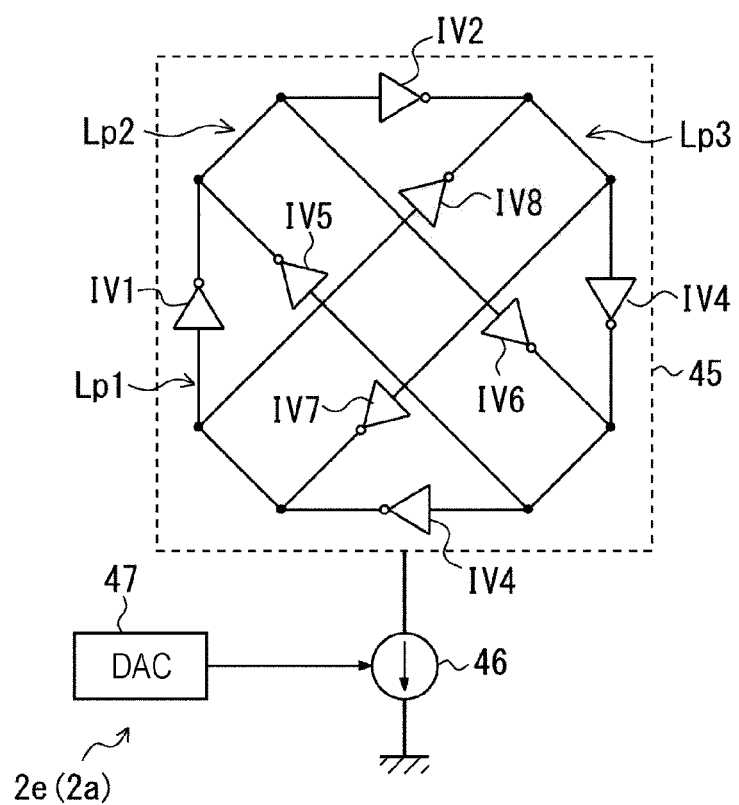
FIG. 25B is a block diagram of a DCO according to a modification.

The DCO 2d in FIG. 25A is an example of an internal configuration of the DCO 2a, and various modifications can be considered for the internal configuration of DCO 2a. FIG. 25B is a block diagram of a DCO 2e as a modification of the DCO 2a. The DCO 2e in FIG. 25B includes a ring DCO 45, a current source 46, and a DAC 47. The ring DCO 45 in FIG. 25B is configured by connecting an even number of inverters in a ring shape. Note that an odd number of inverters may be connected in a ring shape to constitute the ring DCO 45.

The ring DCO 45 in FIG. 25B includes three loop circuits Lp1 to Lp3. Inverters IV1 to IV4 constitute a main loop circuit Lp1, inverters IV5 and IV6 constitute a first sub loop circuit Lp2, and inverters IV7 and IV8 constitute a second sub loop circuit Lp3.

The DCOs 2d and 2e in FIGS. 25A and 25B are configured by using general-purpose circuit elements such as MOS transistors, capacitors, and resistance elements. The internal configurations of the DCOs 2d and 2e shown in FIGS. 25A and 25B are merely examples, and various circuit configurations can be adopted.

In this way, the DCO 2a in the semiconductor integrated circuits 1 to 1q according to the first to ninth embodiments can be configured by an existing DCO 2a having various internal configurations, and can be easily designed.

Eleventh Embodiment

The semiconductor integrated circuits 1 to 1q according to the first to tenth embodiments are common in that the oscillation controller 3 intermittently performs the PLL control of the oscillation frequency of the DCO 2a on the basis of the intermittent control signal. In the present embodiment, noise characteristics of the semiconductor integrated circuits 1 to 1q according to the first to tenth embodiments are analyzed.

Figure 26:
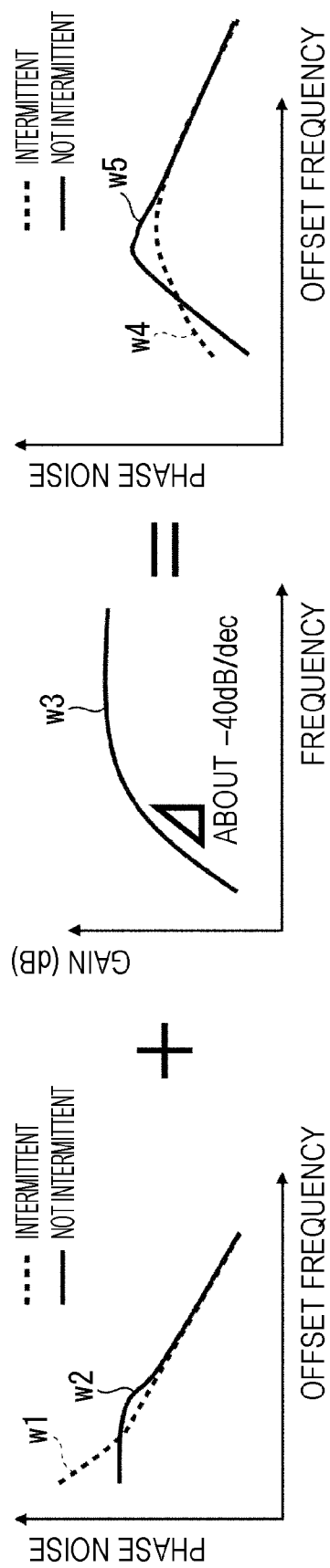
FIG. 26 is a diagram showing phase noise of an imaging device 100 in FIG. 8.

FIG. 26 is a diagram showing phase noise of the imaging device 100 in FIG. 8. FIG. 26 shows waveforms w1 and w2 of a phase noise characteristic of the DCO 2a, a waveform w3 of a jitter included in the output signal of the image sensor 5a that operates in synchronization with the oscillation signal from the DCO 2a, and waveforms w4 and w5 of a characteristic combining the above. The waveform w1 indicates a phase noise in a case where the oscillation frequency of the DCO 2a is intermittently controlled, and the waveform w2 indicates a phase noise in a case where the oscillation frequency of the DCO 2a is continuously controlled. The horizontal axis of the waveforms w1 and w2 represents frequency, and the vertical axis of the waveforms w1 and w2 represents phase noise. The waveform w3 indicates jitter characteristics of the sensor 5 (for example, the image sensor 5a) that operates in synchronization with the oscillation signal output from the DCO 2a. The horizontal axis of the waveform w3 represents frequency, and the vertical axis of the waveform w3 represents gain. The waveforms w4 and w5 are obtained by synthesizing the waveforms w1 to w3. The waveform w4 indicates a phase noise in a case where the oscillation frequency of the DCO 2a is intermittently controlled, and the waveform w5 indicates a phase noise in a case where the oscillation frequency of the DCO 2a is continuously controlled. The waveforms w4 and w5 correspond to phase noise characteristics of an output of the image sensor 5a.

As can be seen from the waveforms w1 and w2, in the low frequency region, the phase noise increases in a case where intermittent control is performed than in a case where intermittent control is not performed. On the other hand, in an intermediate frequency region, there is less phase noise in the case where intermittent control than in the case where intermittent control is not performed. In addition, in a high frequency region, the phase noise is substantially the same between the case where the intermittent control is performed and the case where the intermittent control is not performed.

As shown in the waveform w3, since the image sensor 5a has a low gain in the low frequency region, even if there is a lot of phase noise in the low frequency region as in the waveform w1, an effect of suppressing the phase noise in the low frequency region can be obtained by passing through the image sensor 5a. Therefore, as shown in the waveforms w4 and w5, in a digital imaging signal output from the image sensor 5a, the phase noise in the low frequency region is suppressed, and in the intermediate frequency region, the effect of decreasing the phase noise in the case where intermittent control than in the case where intermittent control is not performed is more emphasized.

As a result, by providing the sensor 5 in the semiconductor integrated circuits 1 to 1q according to the first to tenth embodiments and intermittently controlling the oscillation frequency of the oscillation signal supplied to the sensor 5, the phase noise of the output from the sensor can be reduced.

Twelfth Embodiment

When the oscillation frequency of the DCO 2a in the semiconductor integrated circuits 1 to 1q according to the first to tenth embodiments are controlled by the oscillation controller 3, it is conceivable to provide a ΔΣ modulator in order to control the oscillation frequency more precisely. By providing a ΔΣ modulator in the oscillation controller 3, resolution of the DCO 2a can be improved. However, since a clock signal for operating the ΔΣ modulator is required and the clock signal needs to be continuously operated, in a case where the ΔΣ modulator is provided, intermittent operation by the oscillation controller 3 becomes difficult.

Figure 27:
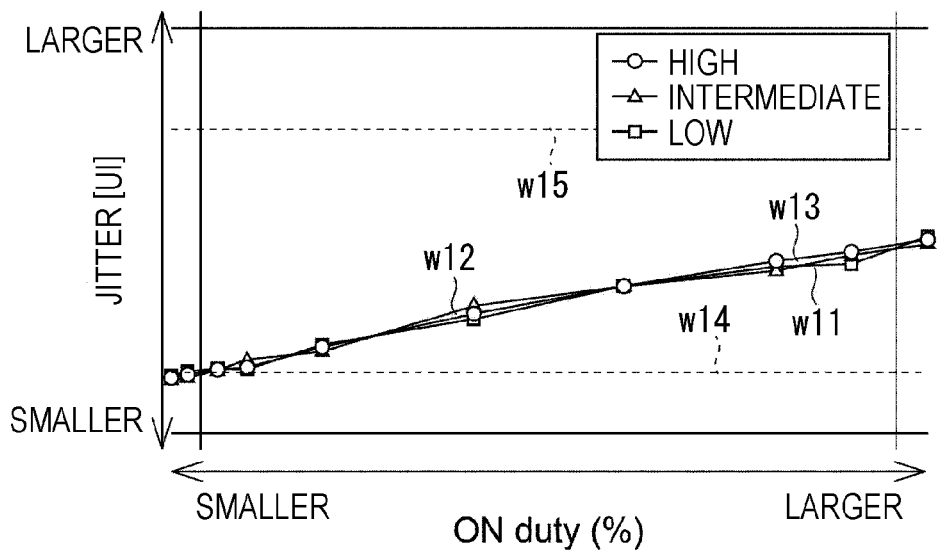
FIG. 27 is a diagram showing a magnitude of jitter in a case where a Σ modulator is provided and in a case where intermittent operation is performed without providing a ΔΣ modulator.

FIG. 27 is a diagram showing a magnitude of jitter in a case where a Σ modulator is provided and in a case where intermittent operation is performed without providing a ΔΣ modulator. In FIG. 27, the horizontal axis represents on-duty [%], and the vertical axis represents jitter. FIG. 27 shows waveforms w11 to w13 in a case where oscillation is performed at three different frequencies. Furthermore, the waveform w14 in a broken line represents a closed loop characteristic of the ΔΣ modulator, and the waveform w15 in a broken line represents a target value of jitter.

In FIG. 27, the larger the on-duty, the longer the period in which the PLL control of the DCO 2a is performed, and thus the jitter increases. As the smaller the on-duty, the longer the period in which the PLL control of the DCO 2a is not performed, and the smaller the jitter to be closer to the closed loop characteristic of the ΔΣ modulator. In consideration of the waveforms w11 to w14 in FIG. 27, it is desirable to select an optimum on-duty that can approach the closed loop characteristics of the ΔΣ modulator as much as possible and reduce the jitter.

In this way, in the semiconductor integrated circuits 1 to 1q according to the first to tenth embodiments, the PLL control of the oscillation frequency of the DCO 2a is performed intermittently, and then the jitter can be reduced by optimizing the on-duty without using the ΔΣ modulator.

Thirteenth Embodiment

In a case where the semiconductor integrated circuits 1 to 1q according to the first to twelfth embodiments is the imaging device 100, the imaging device 100 can be configured by a plurality of stacked semiconductor substrates. Hereinafter, an example in which a first substrate and a second substrate stacked on each other constitute the imaging device 100 will be described. Note that three or more substrates may be stacked to constitute the imaging device 100.

Figure 28A:
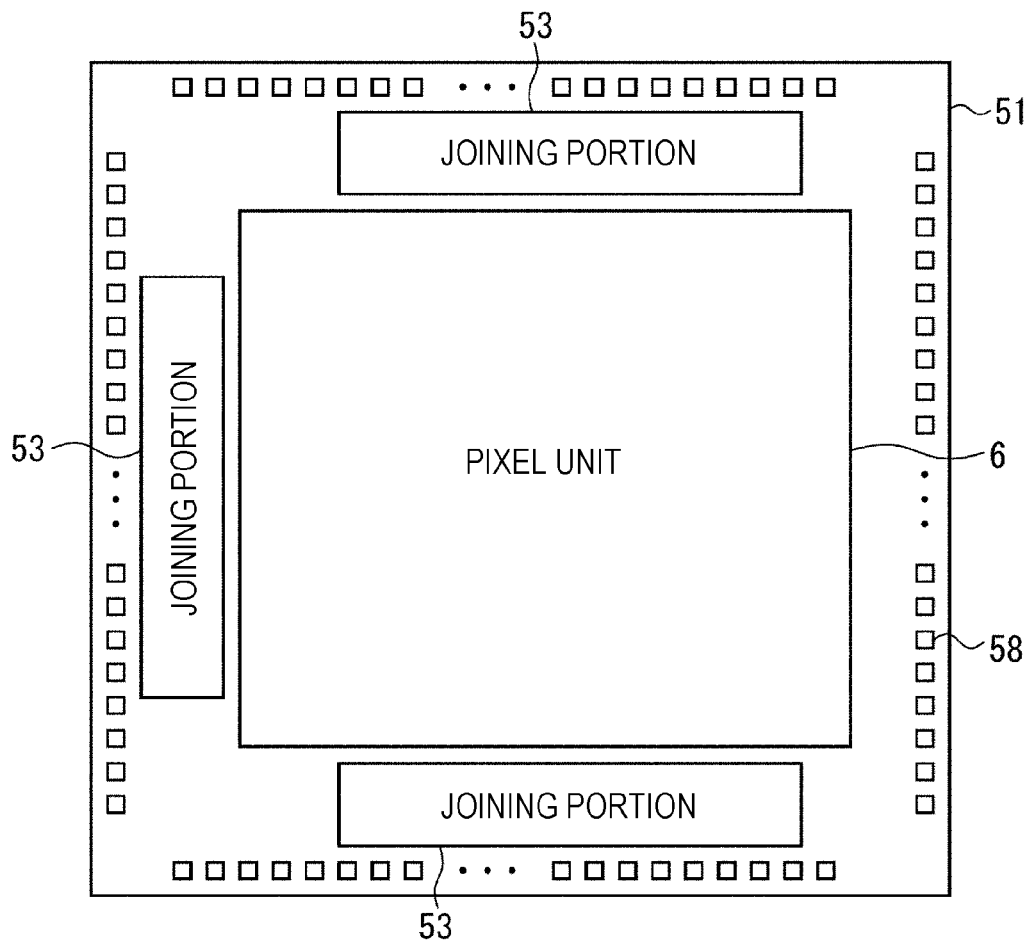
FIG. 28A is a layout diagram of a first substrate.
Figure 28B:
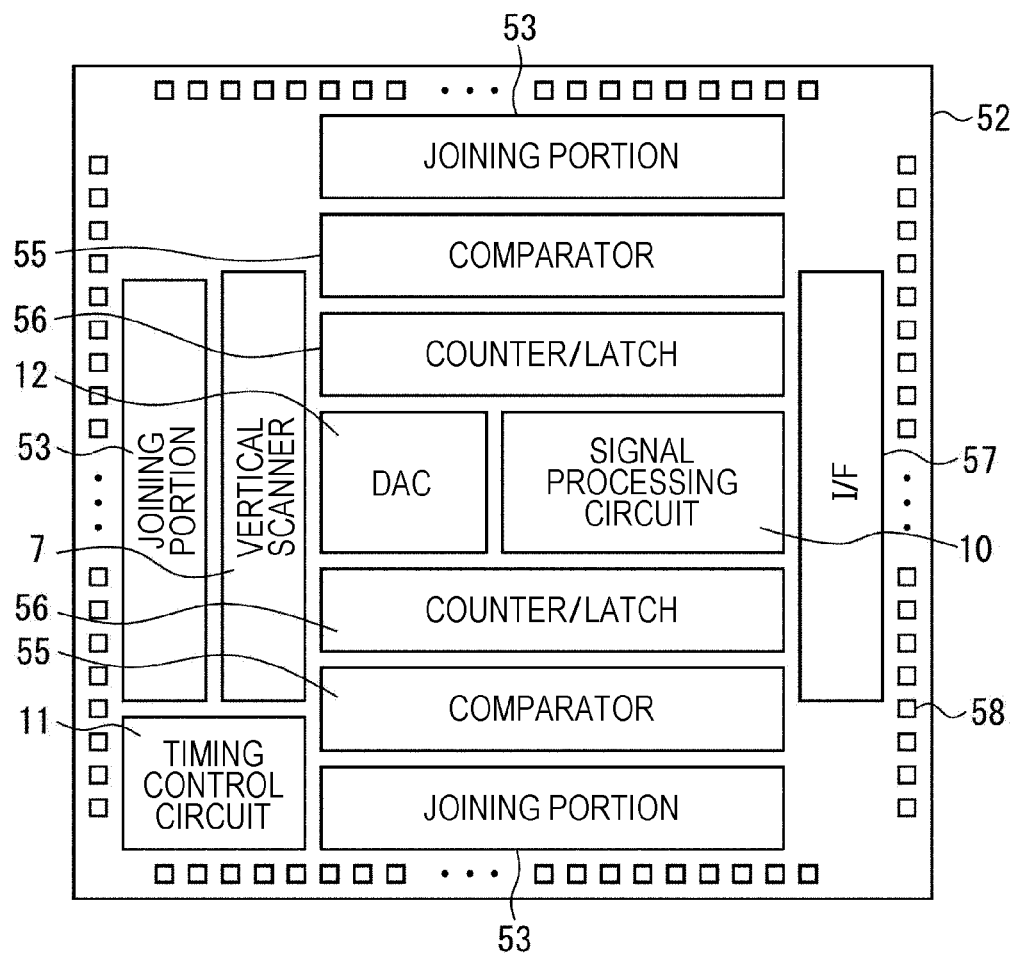
FIG. 28B is a layout diagram of a second substrate.

FIG. 28A is a layout diagram of a first substrate 51, and FIG. 28B is a layout diagram of a second substrate 52. The first substrate 51 and the second substrate 52 are stacked to transmit and receive various kinds of signals with Cu—Cu joints, vias, bumps, conductive pads, or the like.

The first substrate 51 in FIG. 28A is disposed on a light incident side. In the first substrate 51, the pixel array unit 6 and a plurality of joining portions 53 are disposed. In the joining portions 53, Cu—Cu joints, vias, bumps, or the like for transmitting and receiving various kinds of signals between the first substrate 51 and the second substrate 52 are disposed. The joining portions 53 are disposed around the pixel array unit 6.

On the second substrate 52 in FIG. 28B, the timing controller 11, the vertical scanner 7, the DAC 12, the column signal processor 8, the horizontal transfer scanner 9, the signal processing circuit 10, and a PLL unit 54 are disposed. The column signal processor 8 includes a comparator 55, a counter, and a latch 56. The PLL unit 54 includes the DCO 2a, the oscillation controller 3, and the intermittent controller 4.

An interface unit (I/F) 57 for outputting signals subjected to signal processing and inputting signals from the outside to each part in the second substrate 52 is disposed near the signal processing circuit 10. The interface unit includes the high-speed I/F unit 21 in FIG. 7 and the like.

Furthermore, a plurality of pads 58 is disposed along edges of the first substrate 51 and the second substrate 52. Bonding wires for connecting to each part in each substrate are connected to the pads 58.

Note that what components are disposed on the first substrate 51 and the second substrate 52 is arbitrary, and for example, some blocks in the second substrate may be disposed on the first substrate.

Note that the present technology can have the following configurations.

(1) A semiconductor integrated circuit includes
an oscillator that generates an oscillation signal whose oscillation frequency is discretely adjustable on the basis of a digital control input signal,
an oscillation controller that generates the digital control input signal, and
an intermittent controller that generates an intermittent control signal and supplies the intermittent control signal to the oscillation controller so that the oscillation controller intermittently updates the digital control input signal.

(2) In the semiconductor integrated circuit according to (1), the oscillation controller holds the digital control input signal most recently updated in a period in which the digital control input signal is not updated by the intermittent control signal.

(3) In the semiconductor integrated circuit according to (1) or (2), the intermittent controller generates the intermittent control signal in synchronization with a predetermined signal generated in the semiconductor integrated circuit or input to the semiconductor integrated circuit.

(4) The semiconductor integrated circuit according to (1) or (2) further includes
a sensor that performs predetermined sensing in synchronization with the oscillation signal, in which
the intermittent controller generates the intermittent control signal on the basis of a signal generated by the sensor.

(5) In the semiconductor integrated circuit according to (4),
the sensor includes
a pixel array unit including a plurality of pixels each of which performs photoelectric conversion, and
a timing controller that controls a photoelectric conversion timing of the plurality of pixels and a timing of reading a signal that is photoelectrically converted, and
the intermittent controller generates the intermittent control signal on the basis of a signal generated by the timing controller.

(6) In the semiconductor integrated circuit according to (5),
the plurality of pixels is disposed in a horizontal direction and a vertical direction in the pixel array unit,
the timing controller generates a horizontal synchronization signal and a vertical synchronization signal for reading the signal photoelectrically converted by the plurality of pixels, and
the intermittent controller generates the intermittent control signal on the basis of at least one of the horizontal synchronization signal or the vertical synchronization signal.

(7) In the semiconductor integrated circuit according to (6),
the plurality of pixels in the pixel array unit includes a valid pixel and an invalid pixel, and
the intermittent controller generates the intermittent control signal so that the oscillation controller updates the digital control input signal in a predetermined period including a signal output period of the invalid pixel, and after a lapse of the predetermined period, the oscillation controller does not update the digital control input signal until a next signal output period of the invalid pixel.

(8) In the semiconductor integrated circuit according to (7), the predetermined period is longer than the signal output period of the invalid pixel.

(9) In the semiconductor integrated circuit according to (6),
the plurality of pixels in the pixel array unit includes a valid pixel and an invalid pixel, and
the intermittent controller generates the intermittent control signal so that the oscillation controller updates the digital control input signal in a first period including the signal output period of the invalid pixel and in a second period which is a part of a signal output period of the valid pixel, and the oscillation controller does not update the digital control input signal in a period other than the first period and the second period.

(10) In the semiconductor integrated circuit according to (9), a plurality of the second periods is separately provided in the signal output period of the valid pixel.

(11) The semiconductor integrated circuit according to any one of (4) to (10) further includes
- a frequency divider that converts a frequency of the oscillation signal output from the oscillator, in which
- the sensor performs the sensing in synchronization with a frequency-divided oscillation signal output from the frequency divider.

(12) The semiconductor integrated circuit according to any one of (4) to (11) further includes
- a performance evaluator that generates an evaluation signal evaluating performance of the sensing of the sensor, and an update controller that controls a period and a frequency in which the oscillation controller updates the digital control input signal on the basis of the evaluation signal, in which
- the intermittent controller generates the intermittent control signal on the basis of the period and the frequency controlled by the update controller.

(13) In the semiconductor integrated circuit according to (3), the predetermined signal includes a spread spectrum clock control signal.

(14) The semiconductor integrated circuit according to (1) or (2) further includes
- an SSC controller that generates a spread spectrum clock control signal, in which
- the oscillator adjusts the frequency of the oscillation signal on the basis of the digital control input signal and the spread spectrum clock control signal, and
- the intermittent controller generates the intermittent control signal on the basis of the spread spectrum clock control signal.

(15) In the semiconductor integrated circuit according to (14), the spread spectrum clock control signal includes a periodic signal, and the intermittent controller generates the intermittent control signal so that the oscillation controller updates the digital control input signal in a predetermined period in one cycle of the spread spectrum clock control signal, and the oscillation controller does not update the digital control input signal except for in the predetermined period in the one cycle.

(16) In the semiconductor integrated circuit according to (15), the predetermined period is a period including at least one of a peak or a bottom of a signal level of the spread spectrum clock control signal.

(17) A semiconductor integrated circuit includes
- a first oscillator that generates a first oscillation signal whose oscillation frequency is discretely adjustable on the basis of a first digital control input signal,
- a first oscillation controller that generates the first digital control input signal,
- a first intermittent controller that generates a first intermittent control signal and supplies the first intermittent control signal to the first oscillation controller so that the first oscillation controller intermittently updates the first digital control input signal,
- a second oscillator that generates a second oscillation signal whose oscillation frequency is discretely adjustable on the basis of a second digital control input signal,
- a second oscillation controller that generates the second digital control input signal,
- an SSC controller that generates a spread spectrum clock control signal, and
- a second intermittent controller that generates a second intermittent control signal and supplies the second intermittent control signal to the second oscillation controller so that the second oscillation controller intermittently updates the second digital control input signal, in which
- the second oscillator adjusts a frequency of the second oscillation signal on the basis of the second digital control input signal and the spread spectrum clock control signal, and
- the second intermittent controller generates the second intermittent control signal on the basis of the spread spectrum clock control signal.

(18) A semiconductor integrated circuit includes
- a first oscillator that generates a first oscillation signal whose oscillation frequency is discretely adjustable on the basis of a first digital control input signal,
- a first oscillation controller that generates the first digital control input signal,
- a first intermittent controller that generates a first intermittent control signal and supplies the first intermittent control signal to the first oscillation controller so that the first oscillation controller intermittently updates the first digital control input signal,
- a signal transmitter that performs signal transmission in synchronization with the first oscillation signal, and
- a first controller that controls a timing at which the first intermittent controller generates the first intermittent control signal in conjunction with switching of an operation mode of the signal transmitter.

(19) The semiconductor integrated circuit according to (18) includes
- a second oscillator that generates a first oscillation signal whose oscillation frequency is discretely adjustable on the basis of a second digital control input signal,
- a second oscillation controller that generates the second digital control input signal,
- a second intermittent controller that generates a second intermittent control signal and supplies the second intermittent control signal to the second oscillation controller so that the second oscillation controller intermittently updates the second digital control input signal,
- a signal processor that performs signal processing in synchronization with the second oscillation signal, and
- a second controller that controls a timing at which the second intermittent controller generates the second intermittent control signal in conjunction with switching of an operation mode of the signal processor.

(20) The semiconductor integrated circuit according to (18) includes
- a frequency divider that divides a frequency of the first oscillation signal and generates a second oscillation signal,
- a signal processor that performs signal processing in synchronization with the second oscillation signal, and
- a second controller that intermittently controls the frequency divider in conjunction with switching of an operation mode of the signal processor.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the matters defined in the claims and equivalents thereof.

REFERENCE SIGNS LIST 1, 1a, 1b, 1c, 1d, 1e, 1f, 1g, 1h, 1i, 1j Semiconductor integrated circuit
2 Oscillator
2a, 2b DCO (first DCO)
2c DCO (second DCO)
2d, 2e DCO
3 Oscillation controller
3a First oscillation controller
3b Second oscillation controller
4 Intermittent controller
4a First intermittent controller
4b Second intermittent controller
5 Sensor
5a Image sensor
6 Pixel array unit
6a Valid pixel region
6b Invalid pixel region
7 Vertical scanner
8 Column signal processor
9 Horizontal transfer scanner
10 Signal processing circuit
11 Timing controller
13 PLL unit
14 Performance evaluator
15 Update controller
16 SSC controller
21 High-speed I/F unit
22 Reference signal generator
23 Frequency divider
23a First frequency divider
23b Second frequency divider
24 Logic circuit
31 Reference accumulator (REFACC)
31b Reference accumulator
32 Adder
33 Low-pass filter
34 Gain adjustment unit
35 Clock accumulator (VCLKACC)
36 Synchronizer (SYNC)
38 Adder
39 Adder
40 Frequency controller
41 Inductor
42 Variable capacitance unit
42a Variable capacitance element group
42b Variable capacitance element group
42c Variable capacitance element group
43 Negative resistance generator
44 Output amplifier
45 Ring DCO
46 Current source
51 First substrate
52 Second substrate
53 Joining portion
54 PLL unit
55 Comparator
56 Latch
57 Interface unit (I/F)
58 Pad
100 Imaging device

The invention claimed is:

1. A semiconductor integrated circuit, comprising:
an oscillation controller configured to generate a digital control input signal,
an oscillator configured to generate a first oscillation signal, wherein
a first oscillation frequency of the first oscillation signal is adjustable, and
the oscillation controller is further configured to adjust the first oscillation frequency based on the generated digital control input signal;
a sensor configured to generate a first signal, wherein the sensor includes:
a pixel array unit that includes a plurality of pixels, wherein
each pixel of the plurality of pixels is configured to perform photoelectric conversion,
each pixel of the plurality of pixels includes a read circuit, and
the read circuit is configured to read a photoelectric converted signal; and
a timing controller configured to:
control a first timing associated with the photoelectric conversion; and
control a second timing associated with the read photoelectric converted signal; and
an intermittent controller configured to:
generate an intermittent control signal; and
transmit the intermittent control signal to the oscillation controller, wherein
the oscillation controller is further configured to intermittently update the digital control input signal based on the intermittent control signal.

2. The semiconductor integrated circuit according to claim 1, wherein
the oscillation controller is further configured to hold the updated digital control input signal in a specific period, and
the specific period corresponds to a time in which the digital control input signal is not updated.

3. The semiconductor integrated circuit according to claim 1, wherein
the intermittent controller is further configured to generate the intermittent control signal based on the generated first signal.

4. The semiconductor integrated circuit according to claim 1, wherein
the sensor is further configured to perform a sensing operation based on the first oscillation signal, and
the intermittent controller is further configured to generate the intermittent control signal based on the generated first signal.

5. The semiconductor integrated circuit according to claim 4, wherein
the timing controller is further configured to generate a second signal, and
the intermittent controller is further configured to generate the intermittent control signal based on the generated second signal.

6. The semiconductor integrated circuit according to claim 5, wherein
the plurality of pixels is in a horizontal direction and a vertical direction in the pixel array unit,
the timing controller is further configured to generate a horizontal synchronization signal and a vertical synchronization signal, the read circuit is further configured to read the photo-electric converted signal based on the horizontal synchronization signal and the vertical synchronization signal, and the intermittent controller is further configured to generate the intermittent control signal based on at least one of the horizontal synchronization signal or the vertical synchronization signal.

7. The semiconductor integrated circuit according to claim 6, wherein
the plurality of pixels includes a valid pixel and an invalid pixel,
the oscillation controller is further configured to update the digital control input signal in a specific period,
the specific period includes a first signal output period,
the first signal output period is associated with the invalid pixel, and
after a lapse of the specific period, the oscillation controller is further configured to stop the update of the digital control input signal until a second signal output period of the invalid pixel, wherein the second signal output period is after the first signal output period.

8. The semiconductor integrated circuit according to claim 7, wherein the specific period is longer than the first signal output period of the invalid pixel.

9. The semiconductor integrated circuit according to claim 6, wherein
the plurality of pixels includes a valid pixel and an invalid pixel,
the oscillation controller is further configured to update the digital control input signal in a first period and in a second period,
the first period includes a first signal output period of the invalid pixel, and
the second period includes a second signal output period of the valid pixel.

10. The semiconductor integrated circuit according to claim 9, wherein
the second signal output period includes a plurality of second periods, and
the plurality of second periods includes the second period.

11. The semiconductor integrated circuit according to claim 4, further comprising:
a frequency divider configured to:
divide the first oscillation frequency of the first oscillation signal; and
generate a second oscillation frequency based on the division of the first oscillation frequency, wherein the sensor is further configured to perform the sensing operation based on the second oscillation frequency.

12. The semiconductor integrated circuit according to claim 4, further comprising:
a performance evaluator configured to:
generate an evaluation signal;
evaluate a performance of the sensor based on the generated evaluation signal; and
an update controller configured to control a specific period and a specific frequency, wherein
the oscillation controller is further configured to update the digital control input signal based on the evaluation signal,
each of the specific period and the specific frequency is associated with the updated digital control input signal, and the intermittent controller is further configured to generate the intermittent control signal based on the specific period and the specific frequency.

13. The semiconductor integrated circuit according to claim 3, wherein the first signal includes a spread spectrum clock control signal.

14. The semiconductor integrated circuit according to claim 1, further comprising
a spread spectrum clocking (SSC) controller configured to generate a spread spectrum clock control signal, wherein
the oscillator is further configured to adjust the first oscillation frequency based on the digital control input signal and the spread spectrum clock control signal, and
the intermittent controller is further configured to generate the intermittent control signal based on the spread spectrum clock control signal.

15. The semiconductor integrated circuit according to claim 14, wherein
the spread spectrum clock control signal includes a periodic signal,
the oscillation controller is further configured to update the digital control input signal in a specific period, and
a cycle of the spread spectrum clock control signal includes the specific period.

16. The semiconductor integrated circuit according to claim 15, wherein
the specific period includes at least one of a peak of a signal level or a bottom of the signal level, and
the signal level is associated with the spread spectrum clock control signal.

17. A semiconductor integrated circuit, comprising:
a first oscillation controller configured to generate a first digital control input signal;
a first oscillator configured to generate a first oscillation signal, wherein
a first oscillation frequency associated with the first oscillation signal is adjustable, and
the first oscillation controller is further configured to adjust the first oscillation frequency based on the generated first digital control input signal;
a first intermittent controller configured to:
generate a first intermittent control signal; and
transmit the first intermittent control signal to the first oscillation controller, wherein
the first oscillation controller is further configured to intermittently update the first digital control input signal based on the first intermittent control signal;
a second oscillation controller configured to generate a second digital control input signal;
a second oscillator configured to generate a second oscillation signal, wherein
a second oscillation frequency of the second oscillation signal is adjustable,
the second oscillation controller is further configured to adjust the second oscillation frequency based on the generated second digital control input signal;
a spread spectrum clocking (SSC) controller configured to generate a spread spectrum clock control signal; and
a second intermittent controller configured to:
generate a second intermittent control signal; and
transmit the second intermittent control signal to the second oscillation controller, wherein the second oscillation controller is further configured to intermittently update the second digital control input signal, the second oscillator is further configured to adjust the second oscillation frequency based on the second digital control input signal and the spread spectrum clock control signal, and the second intermittent controller is further configured to generate the second intermittent control signal based on the spread spectrum clock control signal.

18. A semiconductor integrated circuit, comprising:

a first oscillation controller configured to generate a first digital control input signal;

a first oscillator configured to generate a first oscillation signal, wherein a first oscillation frequency of the first oscillation signal is adjustable, and the first oscillation controller is further configured to adjust the first oscillation frequency based on the generated first digital control input signal;

a sensor configured to generate a first signal, wherein the sensor includes:

a pixel array unit that includes a plurality of pixels, wherein each pixel of the plurality of pixels is configured to perform photoelectric conversion; and a timing controller configured to control a first timing associated with the photoelectric conversion;

a first intermittent controller configured to:

generate a first intermittent control signal; and transmit the first intermittent control signal to the first oscillation controller, wherein the first oscillation controller is further configured to intermittently update the first digital control input signal;

a signal transmitter configured to perform a signal transmission based on the first oscillation signal; and a first controller configured to control a second timing, wherein the first intermittent controller is further configured to generate, in the second timing, the first intermittent control signal based on an operation mode of the signal transmitter.

19. The semiconductor integrated circuit according to claim 18, comprising:

a second oscillation controller configured to generate a second digital control input signal;

a second oscillator configured to generate a second oscillation signal, wherein a second oscillation frequency of the second oscillation signal is adjustable, and the second oscillation controller is further configured to adjust the second oscillation frequency based on the generated second digital control input signal;

a second intermittent controller configured to:

generate a second intermittent control signal; and transmit the second intermittent control signal to the second oscillation controller, wherein the second oscillation controller is further configured to intermittently update the second digital control input signal;

a signal processor configured to perform a signal processing based on the second oscillation signal; and a second controller configured to control a third timing, wherein the second intermittent controller is further configured to generate, in the third timing, the second intermittent control signal based on an operation mode of the signal processor.

20. The semiconductor integrated circuit according to claim 18, comprising:

a frequency divider configured to:

divide the first oscillation frequency of the first oscillation signal; and generate a second oscillation signal based on the division of the first oscillation frequency;

a signal processor configured to perform a signal processing based on the generated second oscillation signal; and a second controller configured to intermittently control the frequency divider based on an operation mode of the signal processor.

* * * * *